(12) United States Patent
Fujita et al.

(10) Patent No.: US 9,496,685 B2
(45) Date of Patent: Nov. 15, 2016

(54) LASER EMITTING APPARATUS AND MASTER OSCILLATOR POWER AMPLIFIER SYSTEM

(71) Applicant: Sony Corporation, Tokyo (JP)

(72) Inventors: Goro Fujita, Kanagawa (JP); Michio Oka, Tokyo (JP);
(Continued)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/652,500

(22) PCT Filed: Oct. 23, 2013

(86) PCT No.: PCT/JP2013/006271
§ 371 (c)(1),
(2) Date: Jun. 16, 2015

(87) PCT Pub. No.: WO2014/103117
PCT Pub. Date: Jul. 3, 2014

(65) Prior Publication Data
US 2015/0325980 A1 Nov. 12, 2015

(30) Foreign Application Priority Data

Dec. 27, 2012 (JP) ................................ 2012-285027

(51) Int. Cl.
*H01S 5/00* (2006.01)
*H01S 5/14* (2006.01)
(Continued)

(52) U.S. Cl.
CPC ............ *H01S 5/141* (2013.01); *H01S 3/1055* (2013.01); *H01S 5/028* (2013.01); *H01S 5/0267* (2013.01);
(Continued)

(58) Field of Classification Search
CPC .................... H01S 5/141; H01S 5/028; H01S 5/0267; H01S 5/50; H01S 3/1055;
(Continued)

(56) References Cited

U.S. PATENT DOCUMENTS 4,530,574 A * 7/1985 Scifres ................ G02B 27/30
359/641
4,942,583 A * 7/1990 Nazarathy ............ H01S 5/141
372/102
(Continued)

FOREIGN PATENT DOCUMENTS

EP 2451032 A2 5/2012
JP 05-218538 A 8/1993
(Continued)

OTHER PUBLICATIONS

Koda et al., 100 W peak-power 1 GHz repetition picoseconds optical pulse generation using blue-violet GaInN diode laser mode-locked oscillator and optical amplifier. Appl Phys Lett. 2010;97:021101.

*Primary Examiner* — Yuanda Zhang
(74) *Attorney, Agent, or Firm* — Wolf, Greenfield & Sacks, P.C.

(57) ABSTRACT

There is provided a laser emitting apparatus including a semiconductor laser, a grating positioned relative to the semiconductor laser to form a resonator structure therebetween, and an optical system positioned between the semiconductor laser and the grating. The optical system is configured and arranged so that confocal points are formed on both a light emitting surface of the semiconductor laser and a reflection surface of the grating.

20 Claims, 23 Drawing Sheets

(72) Inventors: Hiroshi Yoshida, Kanagawa (JP);
Fumisada Maeda, Tokyo (JP);
Mitsunori Ueda, Tokyo (JP); Kenji Tanaka, Tokyo (JP)

(51) Int. Cl.
| | |
|---|---|
| *H01S 5/026* | (2006.01) |
| *H01S 5/028* | (2006.01) |
| *H01S 5/50* | (2006.01) |
| *H01S 3/1055* | (2006.01) |
| *H01S 5/022* | (2006.01) |
| *H01S 5/065* | (2006.01) |
| *H01S 5/40* | (2006.01) |

(52) U.S. Cl.
CPC ............... *H01S 5/50* (2013.01); *H01S 5/0064* (2013.01); *H01S 5/0265* (2013.01); *H01S 5/02248* (2013.01); *H01S 5/0657* (2013.01); *H01S 5/4006* (2013.01); *H01S 2301/02* (2013.01)

(58) Field of Classification Search
CPC ............... H01S 5/4006; H01S 5/02248; H01S 5/0265; H01S 2301/02; H01S 5/0064; H01S 5/0657
See application file for complete search history.

(56) References Cited

U.S. PATENT DOCUMENTS

| | | |
|---|---|---|
| 5,452,312 A | 9/1995 | Yamamoto et al. |
| 2012/0099185 A1* | 4/2012 | Yokoyama ............. B82Y 20/00 359/340 |

FOREIGN PATENT DOCUMENTS

| | | |
|---|---|---|
| JP | 2002-116062 A | 4/2002 |
| JP | 2005-322813 A | 11/2005 |
| JP | 2008-071798 A | 3/2008 |
| JP | 2008-130805 A | 6/2008 |
| JP | 2008-192902 A | 8/2008 |
| JP | 2009-026834 A | 2/2009 |
| JP | 2012-248745 A | 12/2012 |
| WO | WO 2006/079100 A2 | 7/2006 |

* cited by examiner

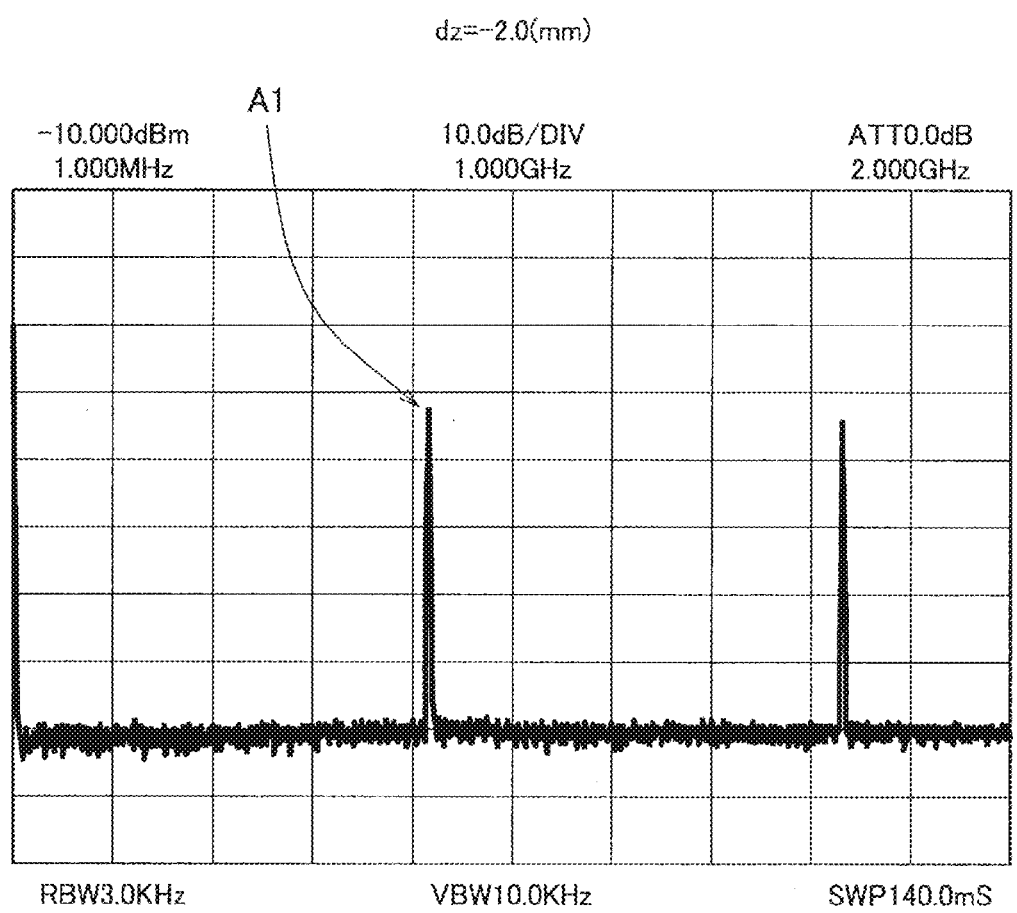

Fig. 13C
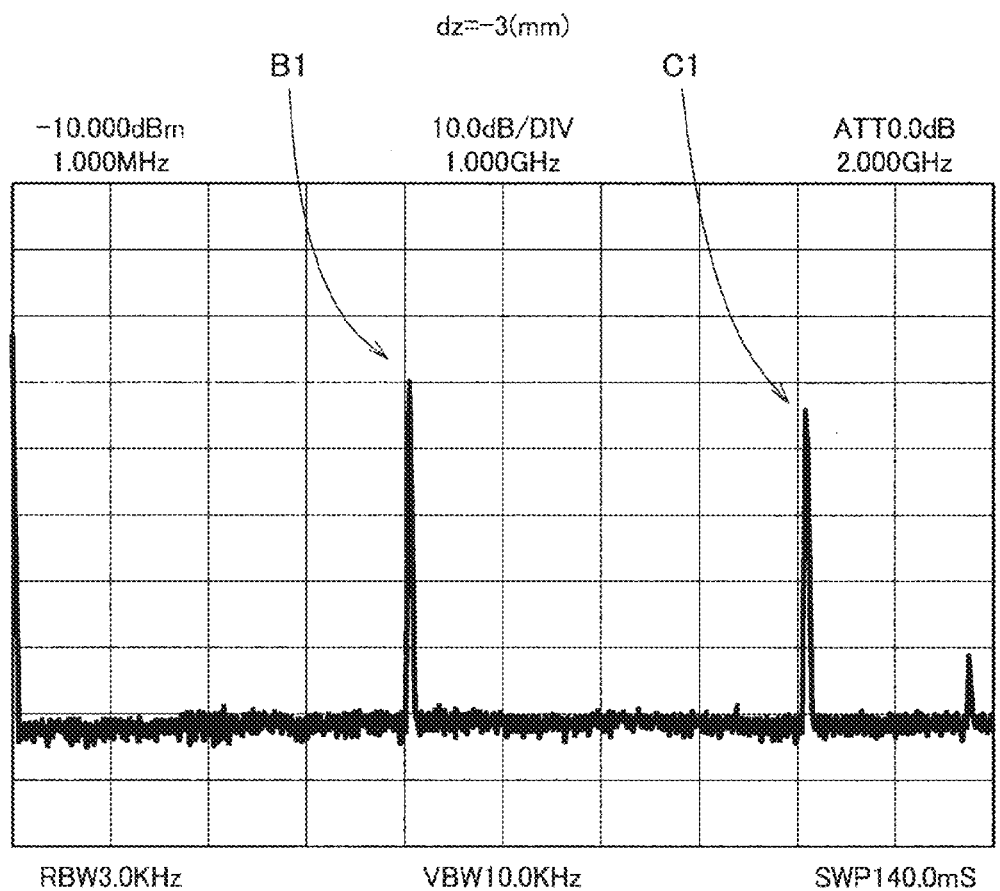
[Fig. 14]
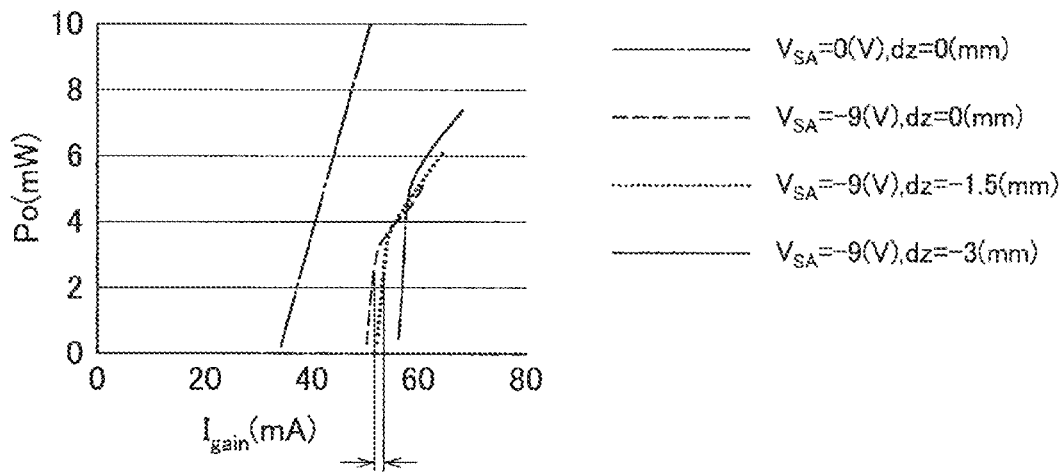

US 9,496,685 B2

LASER EMITTING APPARATUS AND MASTER OSCILLATOR POWER AMPLIFIER SYSTEM

TECHNICAL FIELD

The present disclosure relates to a laser emitting apparatus and a method for manufacturing the laser emitting apparatus.

The present disclosure contains subject matter related to that disclosed in Japanese Priority Patent Application JP 2012-285027 filed in the Japan Patent Office on Dec. 27, 2012, the entire content of which is hereby incorporated by reference.

BACKGROUND ART

In an external resonator laser emitting apparatus, a resonator structure is formed between a laser light source and an external mirror. As external resonators, a Littrow external resonator and a Littman external resonator are known, in each of which a grating (diffraction grating) is used as the external mirror.

In the Littrow external resonator and the Littman external resonator, light emitted from the laser light source is reflected by the grating and resonated between the grating and the laser light source, so that the resonator structure is formed. Note that light incident on the grating is diffracted at different angles according to wavelength depending on a structure of the grating. Here, examples of structures of the grating with regard to diffraction conditions of incident light include intervals between grooves on a reflection surface (grating intervals), a disposition angle with respect to the laser light source (incident angle of the incident light to the grating), and the like. Therefore, by adjusting such a structure of the grating with regard to diffraction conditions and controlling diffraction angles of light of a desired wavelength band, the wavelength band of light to be returned to the laser light source can be selected. In this manner, in the external resonator laser emitting apparatus using the grating, the wavelength band of light to be resonated can be controlled.

On the other hand, in the external resonator laser emitting apparatus using the grating, when the wavelength of light to be resonated is changed by changing the structure of the grating, in accordance with the change in wavelength, the direction of an optical axis of output light from the external resonator laser emitting apparatus is also changed. Therefore, in the external resonator laser emitting apparatus using the grating, a technique to correct the change in optical axis in accordance with wavelength selection has been proposed.

For example, Patent Document 1 discloses a technique in which the optical axis does not shift in accordance with the change in wavelength by changing a thickness of a volume type diffraction grating (width of incident direction of emitted light from the laser light source to the volume type diffraction grating). In addition, for example, Patent Documents 2 and 3 disclose a technique in which a degree of freedom of selecting the wavelength is increased and the shift of the optical axis is corrected by further providing a prism between the laser light source and the grating or in a latter part of the grating.

CITATION LIST

Patent Literature

PTL 1: JP 2008-192902A
PTL 2: JP 2008-071798A
PTL 3: JP 2005-322813A

SUMMARY

Technical Problem

Here, in the resonator structure formed between the laser light source and the grating, the resonance efficiency thereof and the wavelength of light to be resonated largely depend on a relative position relation between the laser light source and the grating. Here, the resonance efficiency is represented by, for example, a ratio of light that is reflected by the grating and returned to the laser light source to emitted light from the laser light source. Therefore, even when the disposition angle of the grating with respect to the laser light source is only slightly changed, the ratio of light reflected by the grating and returned to the laser light source might be decreased and the resonance efficiency might be decreased. Such a decrease in resonance efficiency causes a decrease in the intensity (power) of the final output light from the laser emitting apparatus.

On the other hand, the relative position relation between the laser light source and the grating might be changed without intention by, for example, a change in ambient temperature, mechanical distortion generated in the apparatus itself, or the like. Such a change in the relative position relation between the laser light source and the grating might cause a change in the wavelength or intensity of the output light, and accordingly, desired output might fail to be obtained stably, and reliability of the apparatus might be decreased. The techniques proposed in the above Patent Documents 1 to 3 are not necessarily effective against such a decrease in reliability.

In view of the above, a laser emitting apparatus has been demanded to secure a degree of freedom of selecting the wavelength and stable output. Therefore, the present disclosure proposes a novel and improved laser emitting apparatus by which more stable output can be obtained and a method for manufacturing the laser emitting apparatus.

Solution to Problem

According to an embodiment there is provided a laser emitting apparatus including a semiconductor laser, a grating positioned relative to the semiconductor laser to form a resonator structure therebetween, and an optical system positioned between the semiconductor laser and the grating. The optical system is configured and arranged so that confocal points are formed on both a light emitting surface of the semiconductor laser and a reflection surface of the grating.

According to another embodiment there is provided master oscillator power amplifier system including a laser emitting apparatus and a semiconductor optical amplifier. The laser emitting apparatus includes a semiconductor laser, a grating positioned relative to the semiconductor laser to form a resonator structure therebetween, and an optical system positioned between the semiconductor laser and the grating. The optical system is configured and arranged so that confocal points are formed on both a light emitting surface of the semiconductor laser and a reflection surface of the grating.

Advantageous Effects of Invention

According to an embodiment of the present disclosure, as described above, it is possible to obtain more stable output.

BRIEF DESCRIPTION OF DRAWINGS

FIG. 9B is a graph showing the spectra of the output light from the laser emitting apparatus;

FIG. 13C is a graph showing the spectra of the output light from the laser emitting apparatus according to the second embodiment of the present disclosure;

FIG. 14 is a graph showing a change in mode-locked oscillation threshold value of the laser emitting apparatus according to the second embodiment of the present disclosure;

DESCRIPTION OF EMBODIMENTS

Figure 1A:
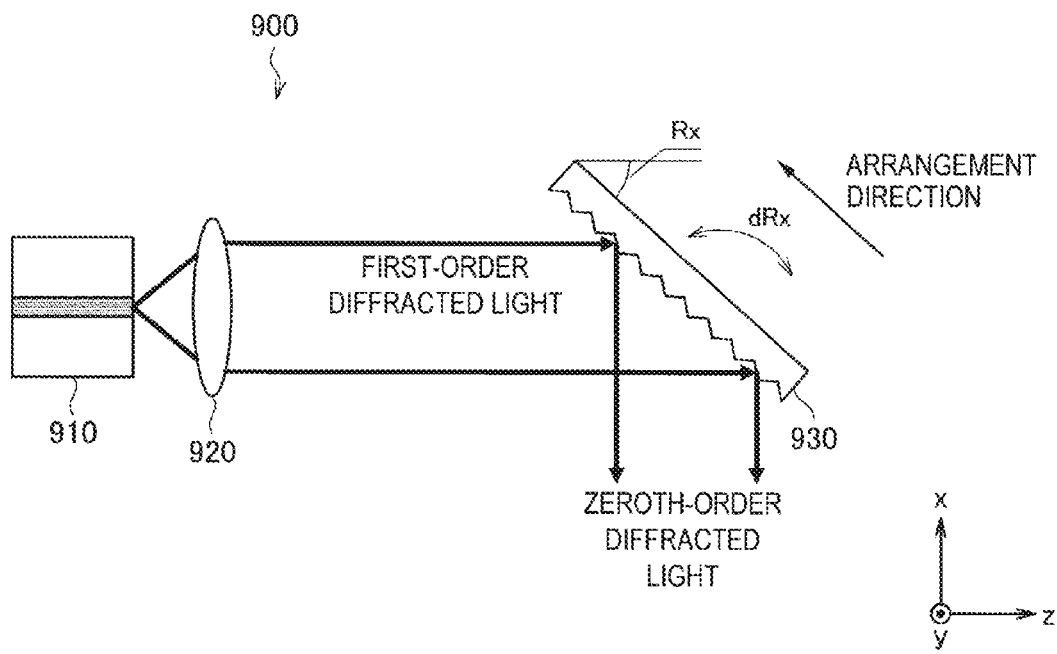
FIG. 1A is a top view illustrating a structure example of a general Littrow external resonator laser emitting apparatus.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

Note that a description will be made in the following order.

1. Discussion on general external resonator laser emitting apparatus
2. First Embodiment
2-1. Schematic structure of laser emitting apparatus according to first embodiment
2-2. Effects of laser emitting apparatus according to first embodiment
3. Second Embodiment
3-1. Discussion on relay lens
3-2. Schematic structure of laser emitting apparatus according to second embodiment
3-3. Effects of laser emitting apparatus according to second embodiment
4. Modulation examples
4-1. Application to MOPA system
4-2. Modulation examples in lens structure (lens system)
5. Conclusion <1. Discussion on General External Resonator Laser Emitting Apparatus>

Before a description of preferred embodiments of the present disclosure, in order to make contents of the present disclosure clearer, a structure of a general external resonator laser emitting apparatus will be described first. The following will show results of the present inventors' discussions on the general external resonator laser emitting apparatus and backgrounds in which the present inventors have reached the present disclosure.

Figure 1B:
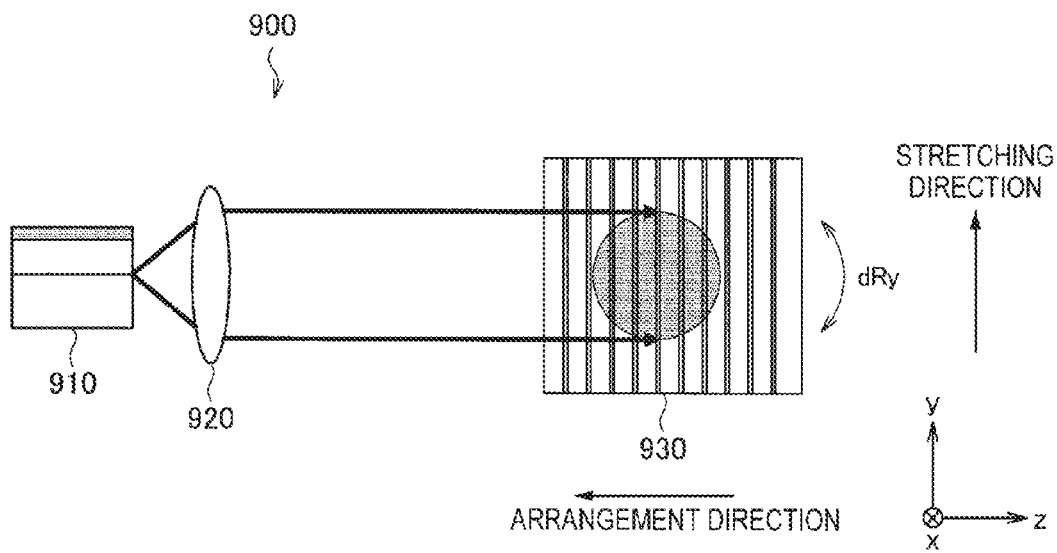
FIG. 1B is a side view illustrating the structure example of the general Littrow external resonator laser emitting apparatus.
Figure 2:
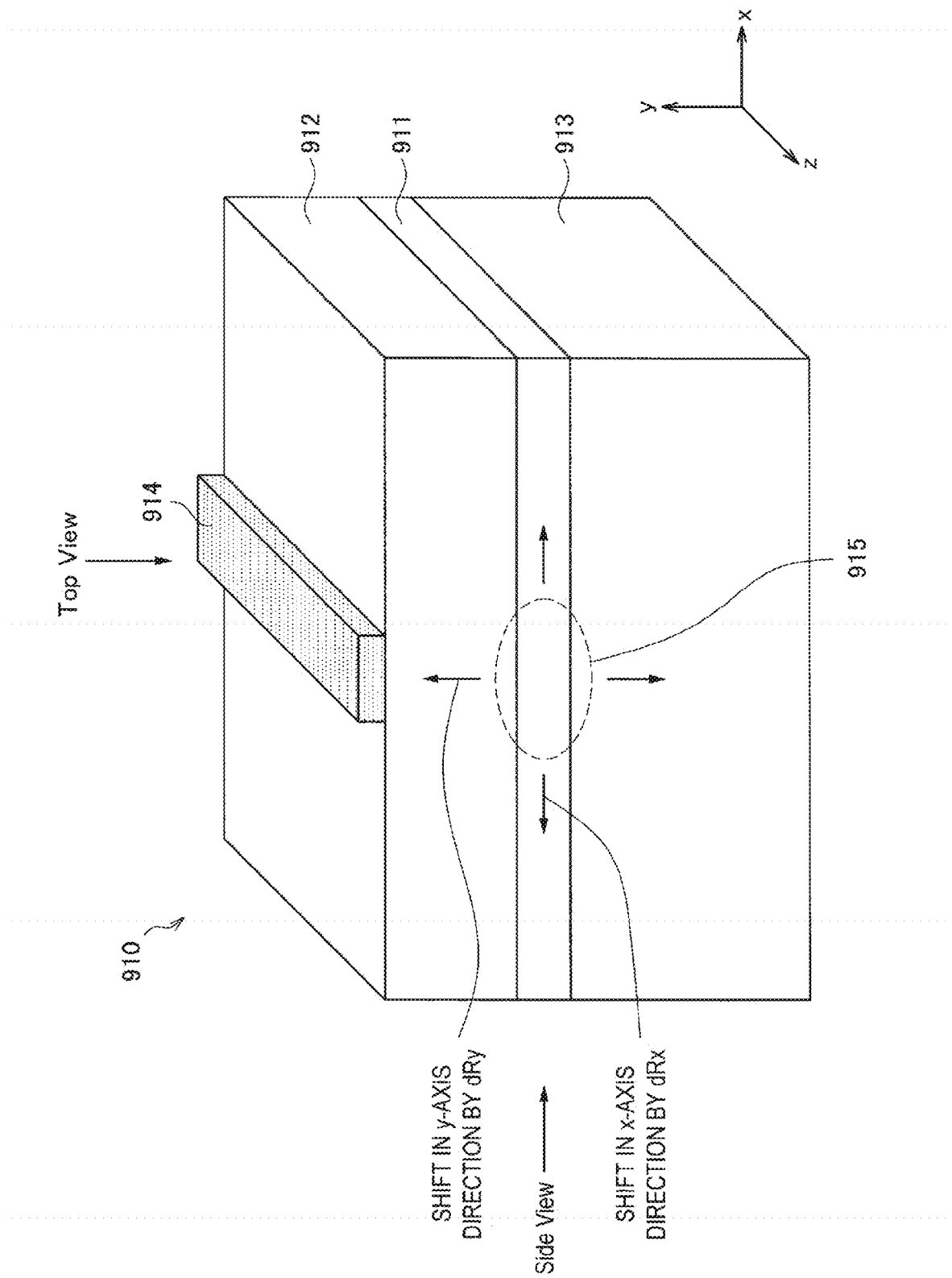
FIG. 2 is a schematic view illustrating a structure example of a general laser diode used as a laser light source of the Littrow external resonator laser emitting apparatus.

A schematic structure of an external resonator laser emitting apparatus having a general Littrow external resonator (hereinafter, also referred to as Littrow external resonator laser emitting apparatus) will be described with reference to FIG. 1A, FIG. 1B, and FIG. 2. FIG. 1A is a top view illustrating a structure example of the general Littrow external resonator laser emitting apparatus. FIG. 1B is a side view illustrating the structure example of the general Littrow external resonator laser emitting apparatus. FIG. 2 is a schematic view illustrating a structure example of a general semiconductor laser (laser diode) used as a laser light source of the Littrow external resonator laser emitting apparatus.

Referring to FIG. 1A and FIG. 1B, a general Littrow external resonator laser emitting apparatus 900 includes a semiconductor laser (laser diode) 910, a collimator lens (CL) 920, and a grating (diffraction grating) 930. As illustrated in FIG. 1A and FIG. 1B, light (emitted light) emitted from the laser diode 910 passes through the collimator lens 920 and is incident on the grating 930. Here, in the description below, a direction in which light is emitted from the laser diode 910 toward the grating 930 in the Littrow external resonator laser emitting apparatus 900 is defined as a positive direction of a z-axis. That is, a z-axis direction is an optical axis direction between the laser diode 910 and the grating 930. Further, the direction that is perpendicular to the optical axis direction and parallel to a stretching direction of grooves provided on a reflection surface of the grating is defined as a y-axis direction. Furthermore, the direction that is perpendicular to the y-axis and the z-axis is defined as an x-axis direction.

The laser diode 910 is one example of a laser light source of the Littrow external resonator laser emitting apparatus 900. The laser diode 910 has a structure in which an active layer is sandwiched between a p-type semiconductor cladding layer and an n-type semiconductor cladding layer. Light is generated by recombination of electrons and holes in the active layer, and a resonator structure causes the light to be resonated within a predetermined region. The light is amplified in the same phase and regularly oscillated, so that the laser diode 910 emits laser light with the same phase. A specific structure of the laser diode 910 will be described later with reference to FIG. 2.

The collimator lens 920 is, for example, a spherical lens or an aspheric lens provided between the laser diode 910 and the grating 930, and makes the emitted light from the laser diode 910 generally parallel light to be incident on the grating 930. Note that a shape (e.g., curvature) and a material (e.g., refractive index, reflectance, or transmittance) of the collimator lens 920 may be determined as appropriate without any particular limitation, in accordance with the wavelength of the emitted light from the laser diode or the like.

The grating (diffraction grating) 930 diffracts the incident light to a predetermined direction. For example, the grating 930 is a plate-like member, and a plurality of grooves are formed at predetermined intervals on a surface of the grating 930. As illustrated in FIG. 1A and FIG. 1B, the grating 930 is provided such that the surface (reflection surface) on which the grooves are provided faces the laser diode 910 with an inclination at a predetermined angle with respect to the optical axis (z axis) connecting the laser diode 910 and the grating 930.

As illustrated in FIG. 1A, the grating 930 is provided so as to be inclined at a predetermined angle Rx with respect to the z-axis on a plane regulated by the x-axis and the z-axis (hereinafter referred to as x-z plane). Here, the x-z plane is also a plane regulated by the z-axis and an arrangement direction of the grooves provided on the grating 930. As illustrated in FIG. 1A, when the emitted light from the laser diode 910 is incident on the surface of the grating 930 on which the grooves are formed, in accordance with the disposition angle Rx of the grating 930, first-order diffracted light of the emitted light passes through the collimator lens 920 and is returned to the laser diode 910. Further, zeroth-order diffracted light of the incident light on the grating 930 is reflected at the same angle as the incident angle and is output outside. Here, as described later with reference to FIG. 2, a surface (surface positioned in a negative direction of the z-axis) opposite to the light emitting surface of the laser diode 910 is subjected to high reflection (HR) coating, so that light returned to the laser diode 910 is reflected by the HR coating and is emitted again toward the grating 930. In this manner, in the Littrow external resonator laser emitting apparatus 900, the resonator structure is formed between the laser diode 910 and the grating 930. Here, the angle of diffraction and wavelength of the first-order diffracted light and the interval between the grooves on the grating 930 satisfy Bragg's law (2d sin(R)=nh, d is the interval between the grooves on the grating 930, h is the wavelength of the incident light, R is the angle of diffraction, and n is an integer). Therefore, by determining the interval between the grooves on the grating 930 and the disposition angle Rx considering Bragg's law, light of a desired wavelength can be resonated. Further, the emitted light from the laser diode 910 is incident with a predetermined expanse (width) in the arrangement direction of the grooves on the grating 930, so that a wavelength band of light to be returned to the laser diode 910 as the first-order diffracted light is secured.

On the other hand, as illustrated in FIG. 1B, the grating 930 is provided such that a plane regulated by the y-axis and the z-axis (hereinafter referred to as y-z plane) has an inclination at a predetermined angle Ry with respect to the z-axis. Although Ry=0(Rad) in the example illustrated in FIG. 1B, Ry is adjusted so that the light returned from the grating 930 can be incident on a later-described light spot 915 (position where light is emitted) on a light emitting surface of the laser diode 910 and associativity in the resonator can be maximum, that is, the resonance efficiency can be maximum.

Next, a general structure of the laser diode 910 will be described with reference to FIG. 2. The laser diode 910 has a stacked layer structure in which an active layer 911 is sandwiched between a p-type cladding layer 912 and an n-type cladding layer 913. Further, on a top surface of the p-type cladding layer 912 in a stacked layer direction, for example, a stripe-form electrode 914 is provided. By applying voltage to the electrode 914, electrons are injected to the active layer 911 and recombination between electrons and holes is promoted in the active layer 911. Then, light generated by the recombination is emitted from a light spot 915 on an end surface of the active layer 911 to the positive direction of the z-axis. Note that as main materials for the active layer 911, the p-type cladding layer 912, and the n-type cladding layer 913, for example, III to V semiconductors are used.

Here, in the following description, as illustrated in FIG. 2, the direction in which the n-type cladding layer 913, the active layer 911, and the p-type cladding layer 912 are stacked in the laser diode 910 is defined as a positive direction of the y-axis in the laser diode 910. The y-axis direction is also referred to as vertical direction. Further, in a direction perpendicular to the vertical direction (i.e., x-axis direction), the left direction of the left-right direction when seeing a direction in which light is emitted from the laser diode 910 is defined as a positive direction of the x-axis. Further, the x-axis direction is also referred to as horizontal direction. Note that the top view illustrated in FIG. 1A corresponds to a view seen from the positive direction of the y-axis among vertical directions in FIG. 2, and the side view illustrated in FIG. 1B corresponds to a view seen from a negative direction of the x-axis among horizontal directions in FIG. 2. In this manner, the direction in which the n-type cladding layer 913, the active layer 911, and the p-type cladding layer 912 are stacked in the laser diode 910 generally corresponds to the y-axis direction, that is, the stretching direction of the grooves provided on the grating 930.

Further, in a back surface (surface in the negative direction of the z-axis) of the laser diode 910, at least a region corresponding to an end surface of the active layer 911 is subjected to high reflection (HR) coating, and in a front surface (surface in the positive direction of the z-axis direction), i.e., the light emitting surface, at least a region corresponding to an end surface of the active layer 911 is subjected to antireflection (AR) coating. As described above, the first-order diffracted light by the grating 930 of light emitted from the laser diode 910 is returned to the laser diode 910. The light returned to the laser diode 910 is incident on the active layer 911, reflected by the HR coating on the back surface, and emitted again toward the grating 930.

In this manner, in the Littrow external resonator laser emitting apparatus 900, the resonator structure is formed between the surface (reflection surface) of the grating 930 on which the grooves are formed and the back surface of the laser diode 910. In order to achieve such a resonator structure, it is necessary for the first-order diffracted light from the grating 930 to be returned to the end surface of the active layer 911 in the light emitting surface of the laser diode 910 illustrated in FIG. 2. When the ratio of the light returned from the grating 930 to be incident on the end surface of the active layer 911 is decreased by a certain reason, the resonance efficiency in the resonator structure might be decreased.

Here, a case will be discussed where the relative position relation between the laser diode 910, the collimator lens 920, and the grating 930 is changed in the Littrow external resonator laser emitting apparatus 900. Here, changes in such a relative position relation are expressed by dRx and dRy which are shift amounts from the predetermined angle of the disposition angle of the grating 930. Note that dRx refers to the shift amount of the angle Rx of the grating 930 with respect to the z-axis on the x-y plane as illustrated in FIG. 1A. Note also that dRy refers to the shift amount of the angle Ry of the grating 930 with respect to the z-axis on the y-z plane as illustrated in FIG. 1B.

First, a case will be considered where the disposition angle of the grating 930 shifts from Rx by dRx. In this case, since the incident angle of the emitted light from the laser diode 910 changes with respect to the arrangement direction of the grooves on the grating 930, the wavelength of the light returned to the laser diode 910 changes. Further, an incident position of light returned to the laser diode 910 shifts to the x-axis direction. Here, as illustrated in FIG. 2, the x-axis direction is a direction orthogonal to the stacked layer direction of the laser diode 910, i.e., a direction in which the active layer 910 has an expanse, and accordingly, the resonator structure can be maintained even when the incident position in the x-axis direction shifts somewhat. Therefore, dRx influences the wavelength of light to be resonated rather than the resonance efficiency and also the wavelength of output light from the Littrow external resonator laser emitting apparatus 900.

On the other hand, a case will be considered where the disposition angle of the grating 930 shifts from Ry by dRy. In this case, the incident position of light returned from the grating 930 to the laser diode 910 shifts to the y-axis direction. Here, as illustrated in FIG. 2, the y-axis direction is the stacked layer direction of the laser diode 910, and accordingly, even when the incident position shifts only slightly, the returned light might not be incident on the end surface of the active layer 911 and the resonance efficiency might be decreased. Therefore, dRy largely influences the resonance efficiency and also the intensity of output light from the Littrow external resonator laser emitting apparatus 900.

The schematic structure of the general Littrow external resonator laser emitting apparatus 900 has been described above with reference to FIG. 1A, FIG. 1B, and FIG. 2. In such a structure, as described above, the change dRx in an inclination angle of the grating influences selection of the wavelength, and the change dRy in the inclination angle influences the resonance efficiency (associativity). In particular, even a slight change in the angle of dRy might cause a large decrease in resonance efficiency because of the structure of the laser diode 910.

On the other hand, in general, a change in the ambient temperature of the apparatus, a mechanical distortion generated in the apparatus itself, or the like might cause a slight change in the relative position relation between each structure member in the apparatus. For example, the change of the apparatus itself or in the ambient temperature of the apparatus, each structure member itself, a base and supporting members supporting the structure members, and the like might be thermally expanded or thermally contracted. Further, the mechanical distortion due to the composition of the apparatus, aging, or the like, might physically shift the relative position relation between each structure member. Also in the Littrow external resonator laser emitting apparatus 900 illustrated in FIG. 1A and FIG. 1B, with regard to the optical system including the light source, the lens, and the grating, the optical relative position relation might be changed without intention by a distortion due to such a change in temperature or the like. As a result, when Rx or Ry changes, light of a desired wavelength fails to be output at a desired intensity, and the reliability of external resonator laser emitting apparatus might be decreased. Note that in the above description, a result of discussions on the Littrow external resonator laser emitting apparatus as an example of the general external resonator laser emitting apparatus, the above discussion result is also applied to other structures as long as an external resonator laser emitting apparatus uses a grating as the external mirror. For example, also in a case of an external resonator laser emitting apparatus having a Littman external resonator (hereinafter also referred to as Littman external resonator laser emitting apparatus), reliability might be decreased as in the above case.

In view of the above, after discussions on a laser emitting apparatus having higher reliability and securing a degree of freedom of selecting the wavelength, the present inventors have reached the following external resonator laser emitting apparatus and the following method for manufacturing the external resonator laser emitting apparatus. Hereinafter, preferred embodiments of the external resonator laser emitting apparatus and the method for manufacturing the external resonator laser emitting apparatus according to embodiments of the present disclosure will be described in detail. Note that in the description below, each embodiment is described by taking a Littrow external resonator laser emitting apparatus as an example of the external resonator laser emitting apparatus. However, the present disclosure is not limited to this example, and can be applied to an external resonator laser emitting apparatus having any structure as long as the external resonator laser emitting apparatus uses a grating as an external mirror like a Littman external resonator laser emitting apparatus.

<2. First Embodiment>

First, a first embodiment of the present disclosure will be described. Note that in the description below, an external resonator laser emitting apparatus is also simply referred to as laser emitting apparatus, for example.

(2-1. Schematic Structure of Laser Emitting Apparatus According to First Embodiment)

Figure 3A:
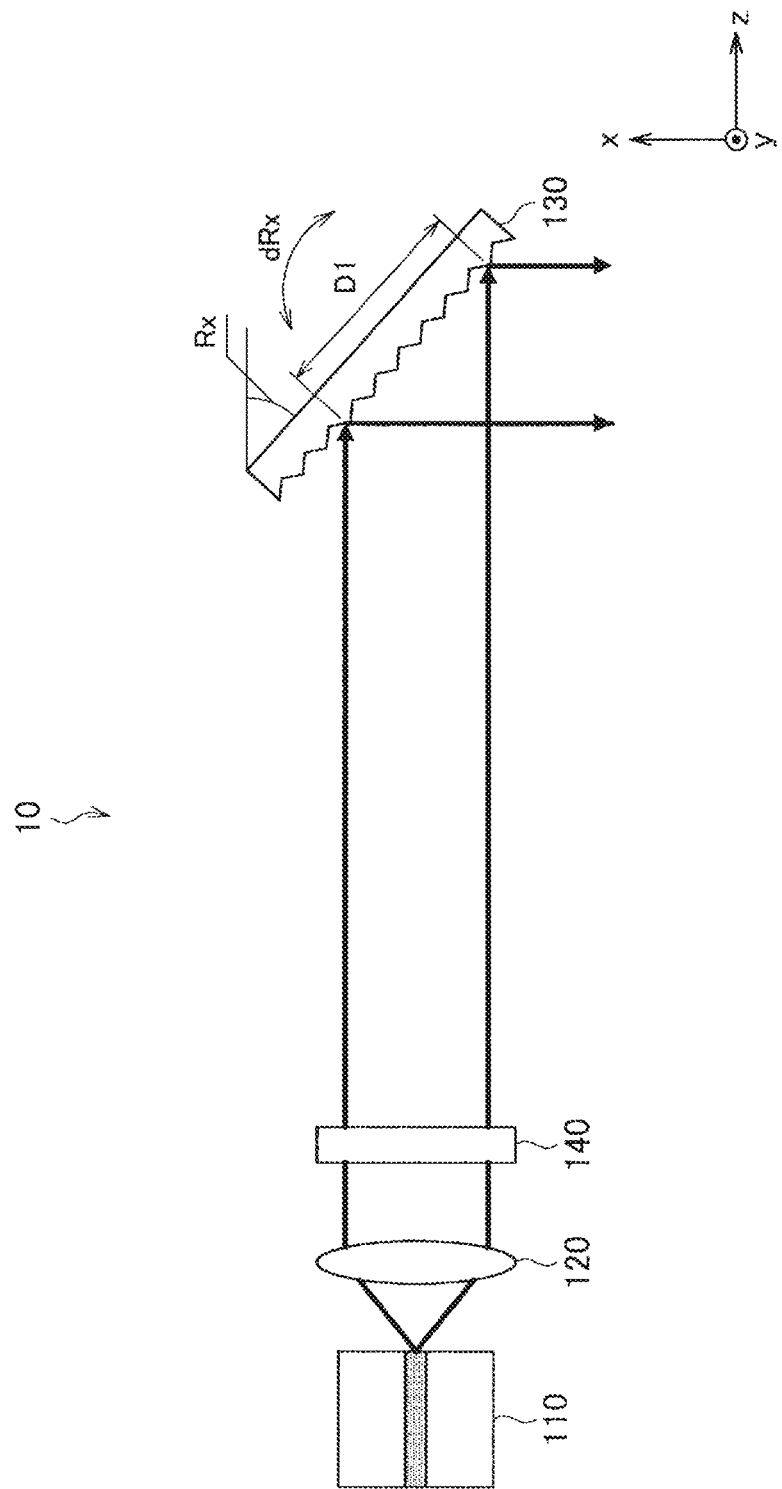
FIG. 3A is a top view illustrating a structure example of a laser emitting apparatus according to a first embodiment of the present disclosure.
Figure 3B:
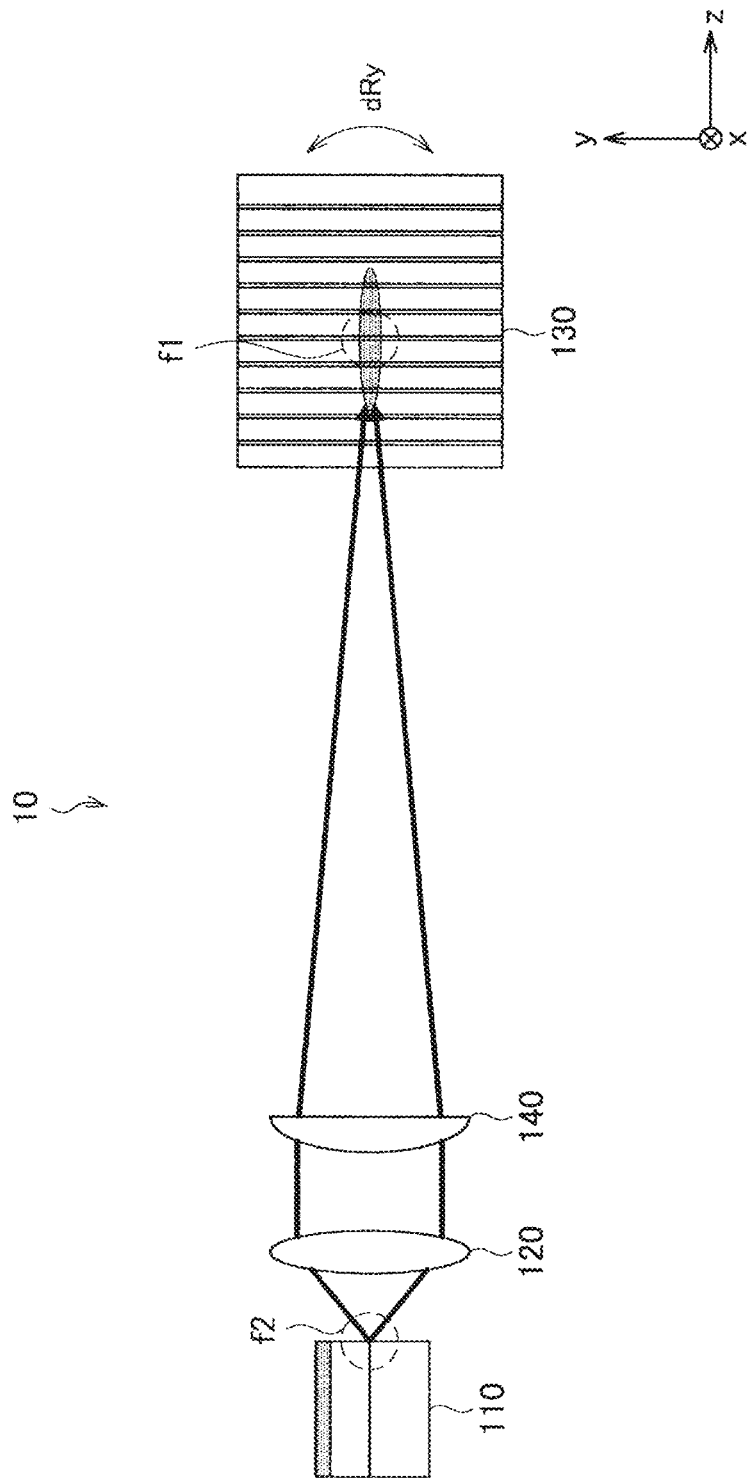
FIG. 3B is a side view illustrating the structure example of the laser emitting apparatus according to the first embodiment of the present disclosure.
Figure 4:
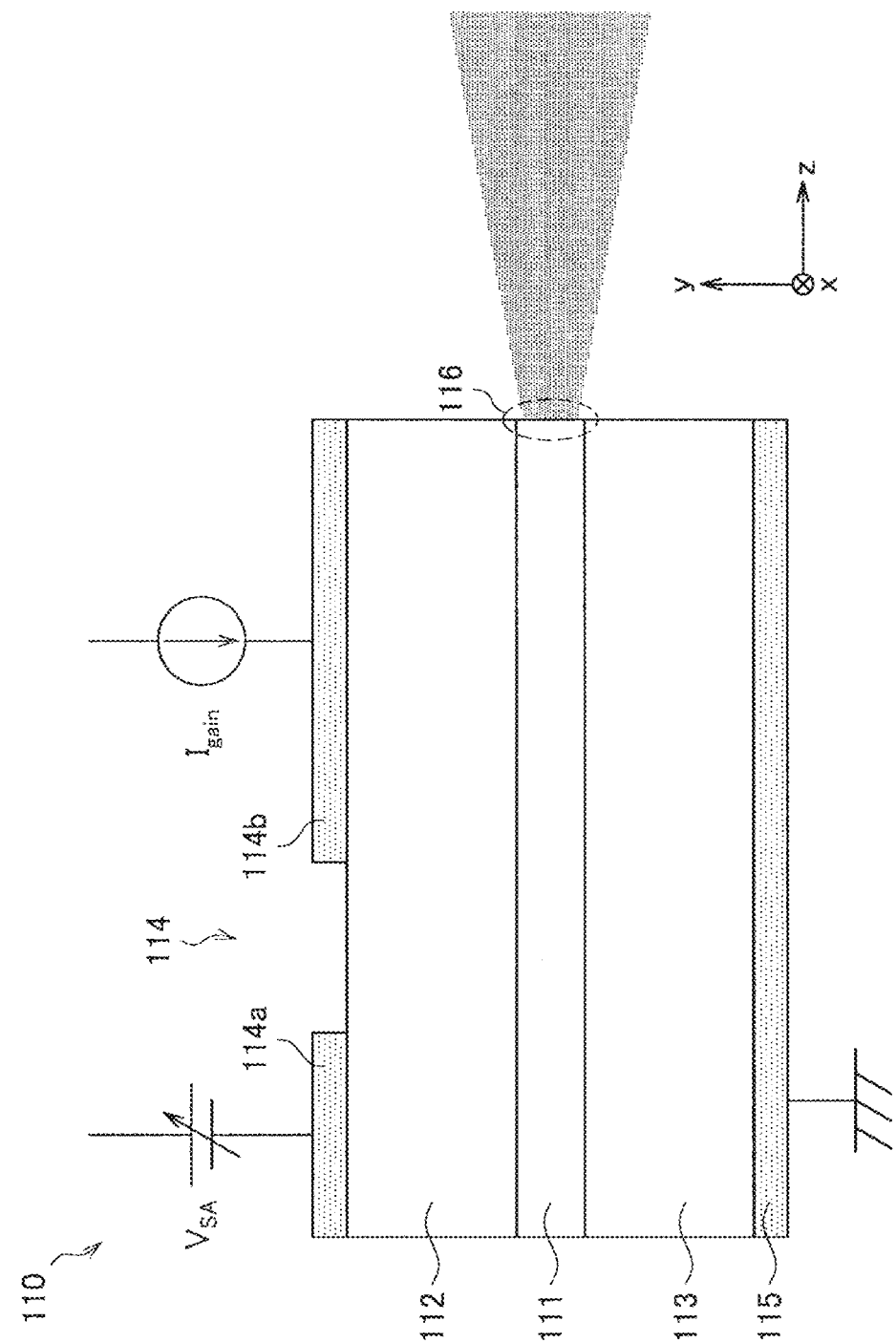
FIG. 4 is a schematic view illustrating a structure example of a laser diode used as a laser light source of the laser emitting apparatus according to the first embodiment of the present disclosure.

First, a schematic structure of an external resonator laser emitting apparatus according to the first embodiment of the present disclosure will be described with reference to FIG. 3A, FIG. 3B, and FIG. 4. FIG. 3A is a top view illustrating a structure example of the laser emitting apparatus according to the first embodiment of the present disclosure. FIG. 3B is a side view illustrating the structure example of the laser emitting apparatus according to the first embodiment of the present disclosure. FIG. 4 is a schematic view illustrating a structure example of a semiconductor laser used as a laser light source of the laser emitting apparatus according to the first embodiment of the present disclosure.

Referring to FIG. 3A and FIG. 3B, a laser emitting apparatus 10 according to the first embodiment of the present disclosure includes a semiconductor laser (laser diode) 110, a collimator lens (CL) 120, a cylindrical lens 140, and a grating (diffraction grating) 130. As illustrated in FIG. 3A and FIG. 3B, emitted light from the laser diode 110 passes through the collimator lens 120 and the cylindrical lens 140, and is incident on the grating 130.

In this manner, a structure of the laser emitting apparatus 10 according to the first embodiment corresponds to a structure in which the cylindrical lens 140 is further provided in a latter part of the collimator lens 920 in the general Littrow external resonator laser emitting apparatus 900 described with reference to FIG. 1A and FIG. 1B. Note that an x-axis, a y-axis, and a z-axis showing coordinate axes, Rx and Ry showing disposition angles of the grating 130, and dRx and dRy in FIG. 3A and FIG. 3B are defined in a manner similar to that of the x-axis, y-axis, z-axis, Rx, Ry, dRx, and dRy in FIG. 1A and FIG. 1B, and therefore a detailed description thereof is omitted.

The laser diode 110 is one example of a laser light source (semiconductor laser) of the Littrow external resonator laser emitting apparatus 10. The laser diode 110 has a structure in which an active layer is sandwiched between a p-type semiconductor cladding layer and an n-type semiconductor cladding layer. Light is generated by recombination of electrons and holes in the active layer, and a resonator structure causes the light to be resonated within a predetermined region. The light is amplified in the same phase and regularly oscillated, so that the laser diode 110 emits laser light with the same phase. A specific structure of the laser diode 110 will be described later with reference to FIG. 4.

The collimator lens 120 is, for example, a spherical lens or an aspheric lens provided between the laser diode 110 and the grating 130, and makes the emitted light from the laser diode 110 generally parallel light. Note that a shape (e.g., curvature) and a material (e.g., refractive index, reflectance, or transmittance) of the collimator lens 120 may be determined as appropriate without any particular limitation, in accordance with the wavelength of the emitted light from the laser diode 130 or the like.

The cylindrical lens 140 is provided between the laser diode 110 and the grating 130 and in a latter part of the collimator lens 120. Therefore, as illustrated in FIG. 3A and FIG. 3B, light made to be generally parallel light by the collimator lens 120 is incident on the cylindrical lens 140.

Here, the cylindrical lens 140 refers to a lens having a cylindrical surface at least on one surface of the lens. Here, the cylindrical surface refers to a surface that has a curvature in one direction but does not have a curvature in the other direction that is orthogonal to the direction. In the first embodiment, the cylindrical lens 140 has a shape in which a cylinder is cut along a surface parallel to an axis (straight line passing through the centers of circles on two surfaces facing each other in the cylinder). With such a shape, the cylindrical lens 140 has a function similar to that of a spherical lens in the direction having the curvature, and has a function similar to that of a planar lens in the direction not having the curvature.

As illustrated in FIG. 3A and FIG. 3B, in the first embodiment, the cylindrical lens 140 is provided such that the cylindrical surface faces the negative direction of the z-axis. Further, the cylindrical lens 140 is provided so as to function as a planar lens on the x-y plane, and to function as a spherical lens on the y-z plane. Functions of the cylindrical lens 140 will be described later in detail.

The grating (diffraction grating) 130 diffracts the incident light to a predetermined direction. For example, the grating 130 is a plate-like member, and a plurality of grooves are formed at predetermined intervals on a surface of the grating 130. As illustrated in FIG. 3A and FIG. 3B, the grating 130 is provided such that the surface (reflection surface) on which the grooves are provided faces the laser diode 110 with an inclination at a predetermined angle with respect to the optical axis (z axis) connecting the laser diode 110 and the grating 130.

As illustrated in FIG. 3A, the grating 130 is provided so as to be inclined at the predetermined angle Rx with respect to the z-axis on the x-z plane. Here, the x-z plane is also a plane regulated by the z-axis and an arrangement direction of the grooves provided on the grating 130. As illustrated in FIG. 3A, when the emitted light from the laser diode 110 is incident on the surface of the grating 130 on which the grooves are formed, in accordance with the disposition angle Rx of the grating 130, first-order diffracted light of the emitted light passes through the collimator lens 120 and the cylindrical lens 140 and is returned to the laser diode 110. Further, zeroth-order diffracted light of the incident light on the grating 130 is reflected at the same angle as the incident angle and is output outside. Here, as described later with reference to FIG. 4, an end surface on a back side of the laser diode 110 (in the negative direction of the z-axis) is subjected to high reflection (HR) coating, so that light returned to the laser diode 110 is reflected by the HR coating and is emitted again toward the grating 130. In this manner, in the laser emitting apparatus 10, the resonator structure is formed between the laser diode 110 and the grating 130. Here, the angle of diffraction and wavelength of the first-order diffracted light and the interval between the grooves on the grating 130 satisfy Bragg's law (2d sin(R)=nh, d is the interval between the grooves on the grating 130, h is the wavelength of the incident light, and R is the angle of diffraction). Therefore, by determining the interval between the grooves on the grating 130 and the disposition angle Rx considering Bragg's law, light of a desired wavelength can be resonated.

On the other hand, as illustrated in FIG. 3B, the grating 130 is provided such that the y-z plane has an inclination at the predetermined angle Ry with respect to the z-axis. Although Ry=0(Rad) in the example illustrated in FIG. 3B, Ry is adjusted so that the light returned from the grating 130 can be incident on a later-described light spot 116 (position where light is emitted) on a light emitting surface of the laser diode 110 and associativity in the resonator can be maximum, that is, the resonance efficiency can be maximum.

Here, functions of the cylindrical lens 140 in the first embodiment will be described in detail. Referring to FIG. 3A and FIG. 3B, at least one cylindrical lens 140 is provided between the laser diode 110 and the grating 130 so that confocal points are formed on the light emitting surface of the laser diode 110 and the reflection surface of the grating 130. Specifically, as illustrated in FIG. 3A, the cylindrical lens 140 is provided so as to function as a planar lens on the x-z plane, that is, so that the direction not having the curvature becomes generally parallel to the x-axis direction. Therefore, on the x-z plane, the emitted light from the laser diode 110 is incident as generally parallel light to the grating 130 with a predetermined expanse (width) D1 with respect to the arrangement direction of the grooves on the grating 130. In this manner, when the emitted light from the laser diode 110 is incident with the predetermined width D1 with respect to the arrangement direction of the grooves on the grating 130, the wavelength band of light to be returned to the laser diode 110 as the first-order diffracted light are secured. Further, by changing Rx (generating dRx), the wavelength of light to be resonated can be selected.

Further, as illustrated in FIG. 3B, the cylindrical lens 140 is provided so as to function as a spherical lens on the y-z plane, that is, such that the direction having the curvature becomes the y-axis direction. Furthermore, the cylindrical lens 140 is provided such that a focal point f1 that is one of the confocal points is formed on the reflection surface of the grating 130 and a focal point f2 that is the other of the confocal points is formed at the light spot (light emitting position) of the laser diode 110. Therefore, on the y-z plane, since the confocal points are formed on the light emitting surface of the laser diode 110 and the reflection surface of the grating 130, the emitted light from the laser diode 110 is resonated between the focal point f1 on the reflection surface of the grating 130 and the focal point f2 on the light emitting surface of the laser diode 110, and a decrease in resonance efficiency due to a change in Ry (dRy) can be suppressed.

Next, a structure of the laser diode 110 according to the first embodiment will be described with reference to FIG. 4. Note that an x-axis, a y-axis, and a z-axis illustrated in FIG. 4 correspond to the respective coordinate axes in FIG. 3A and FIG. 3B.

Referring to FIG. 4, the laser diode 110 has a stacked layer structure in which an active layer 111 is sandwiched between a p-type cladding layer 112 and an n-type cladding layer 113. Further, on a lower surface (a surface in the negative direction of the y-axis) of the n-type cladding layer 113 in the stacked layer direction, an electrode 115 fixed to a ground potential is provided. Furthermore, over a top surface (a surface in the positive direction of the y-axis) of the p-type cladding layer 112 in the stacked layer direction, an electrode 114 is provided. In this manner, the stacked layer direction of the n-type cladding layer 113, the active layer 111, and the p-type cladding layer 112 in the laser diode 110 generally corresponds to the y-axis direction, that is, the stretching direction of the grooves provided on the grating 130.

Here, the laser diode 110 is a so-called bisectional-laser diode (BS-LD) having a saturable absorption (SA) portion and a gain portion. In the laser diode 110, the electrode 114 is divided into two regions due to this structure, and the electrode 114 has two regions: an SA portion electrode 114$a$ and a gain portion electrode 114$b$.

By applying a reverse-bias voltage $V_{SA}$ to the SA portion electrode 114$a$, the laser diode 110 can function as a mode-locked laser light source that emits pulsed light in association with an external mirror. Further, by the value of the voltage $V_{SA}$, light density in the SA portion is adjusted. Since the transmittance of the SA portion changes depending on the light density in the SA portion, by adjusting the voltage $V_{SA}$, the laser diode 110 can function as a short-pulsed mode-locked laser light source. On the other hand, by not applying the voltage $V_{SA}$ ($V_{SA}$=0 (V)), the laser diode 110 can also function as a continuous wave (CW) laser light source. Further, the SA portion also functions as an optical disc. That is, a current value in the SA portion electrode 114$a$ corresponds to the light density, and by monitoring the current value, the light density in the laser diode 110, that is, the intensity of resonance in laser oscillation can be evaluated.

Laser gain current $I_{gain}$ is applied to the gain portion electrode 114$b$. By applying the current $I_{gain}$, electrons are injected to the active layer 111, and recombination between electrons and holes is promoted in the active layer 111. Further, light generated by the recombination is emitted from the light spot 116 on one end surface of the active layer 111 toward the positive direction of the z-axis direction. Note that in this embodiment, there is no particular limitation on the wavelength of the emitted light from the laser diode 110, and light of any wavelength may be applied. Therefore, main materials for the active layer 111, the p-type cladding layer 112, and the n-type cladding layer 113 can be selected as appropriate in accordance with the wavelength of the emitted light from the laser diode 110. For example, as the main materials of the active layer 111, the p-type cladding layer 112, and the n-type cladding layer 113, III-V semiconductors such as GaN, GaAs, GaInN and/or AlGaAs are mainly used.

Further, in a back surface (surface in the negative direction of the z-axis) of the laser diode 110, at least a region corresponding to an end surface of the active layer 111 is subjected to high reflection (HR) coating, and in a front surface (surface in the positive direction of the z-axis direction), i.e., the light emitting surface, at least a region corresponding to an end surface of the active layer 111 is subjected to antireflection (AR) coating. As described above, the first-order diffracted light by the grating 130 of light emitted from the laser diode 110 is returned to the laser diode 110. The light returned to the laser diode 110 is incident on the active layer 111, reflected by the HR coating on the back surface, and emitted again toward the grating 130.

In this manner, in the laser emitting apparatus 10, the resonator structure is formed between the surface (reflection surface) of the grating 130 on which the grooves are provided and the back surface of the laser diode 110. In such a structure, like in the general Littrow external resonator laser emitting apparatus 900 illustrated in FIG. 1A and FIG. 1B, the change dRx in the inclination angle of the grating influences the selection of the wavelength, and the change dRy in inclination angle influences the resonance efficiency (associativity).

Here, in the laser emitting apparatus 10, as described above, at least one cylindrical lens 140 is provided between the laser diode 110 and the grating 130 such that the confocal points are formed on the light emitting surface of the laser diode 110 and the reflection surface of the grating 130. Therefore, the emitted light from the laser diode 110 is resonated between the focal point f1 on the reflection surface of the grating 130 and the focal point f2 on the light emitting surface of the laser diode 110, and it is possible to suppress influences of the change dRy in inclination angle and the decrease in resonance efficiency.

Specifically, the cylindrical lens 140 is provided such that the emitted light from the laser diode 110 is incident on the grating 130 as generally parallel light with a width (expanse) D1 in the arrangement direction of the grooves on the grating 130 on the x-z plane. Further, the cylindrical lens 140 is provided such that the focal point f1 that is one of the confocal points is formed on the reflection surface of the grating 130 and the focal point f2 that is the other of the confocal points is formed at the light spot (light emitting position) of the laser diode 110, on the y-z plane. In this manner, in the laser emitting apparatus 10, the emitted light from the laser diode 110 is incident with the width D1 with respect to the arrangement direction of the groves on the grating 130, so that the wavelength band of light to be returned to the laser diode 110 as the first-order diffracted light is secured. Further, by changing Rx (generating dRx), the wavelength of light to be resonated can be selected. In this manner, in the laser emitting apparatus 10, it is possible to secure the wavelength selectivity and to suppress the decrease in resonance efficiency due to dRy.

The structure of the laser emitting apparatus 10 according to the first embodiment of the present disclosure has been described above with reference to FIG. 3A, FIG. 3B, and FIG. 4. Note that in the above description, the case where the laser diode 110 is the BS-LD is shown with reference to FIG. 4, the first embodiment is not limited to this example. As long as the external resonator structure can be formed, any known laser light source may be used for the laser diode 110 according to the first embodiment, and there is no limitation on the type and structure thereof. Further, in the first embodiment, laser emitted by the laser light source (laser diode) may be pulsed laser or CW laser.

(2-2. Effects of Laser Emitting Apparatus According to First Embodiment)

Figure 5A:
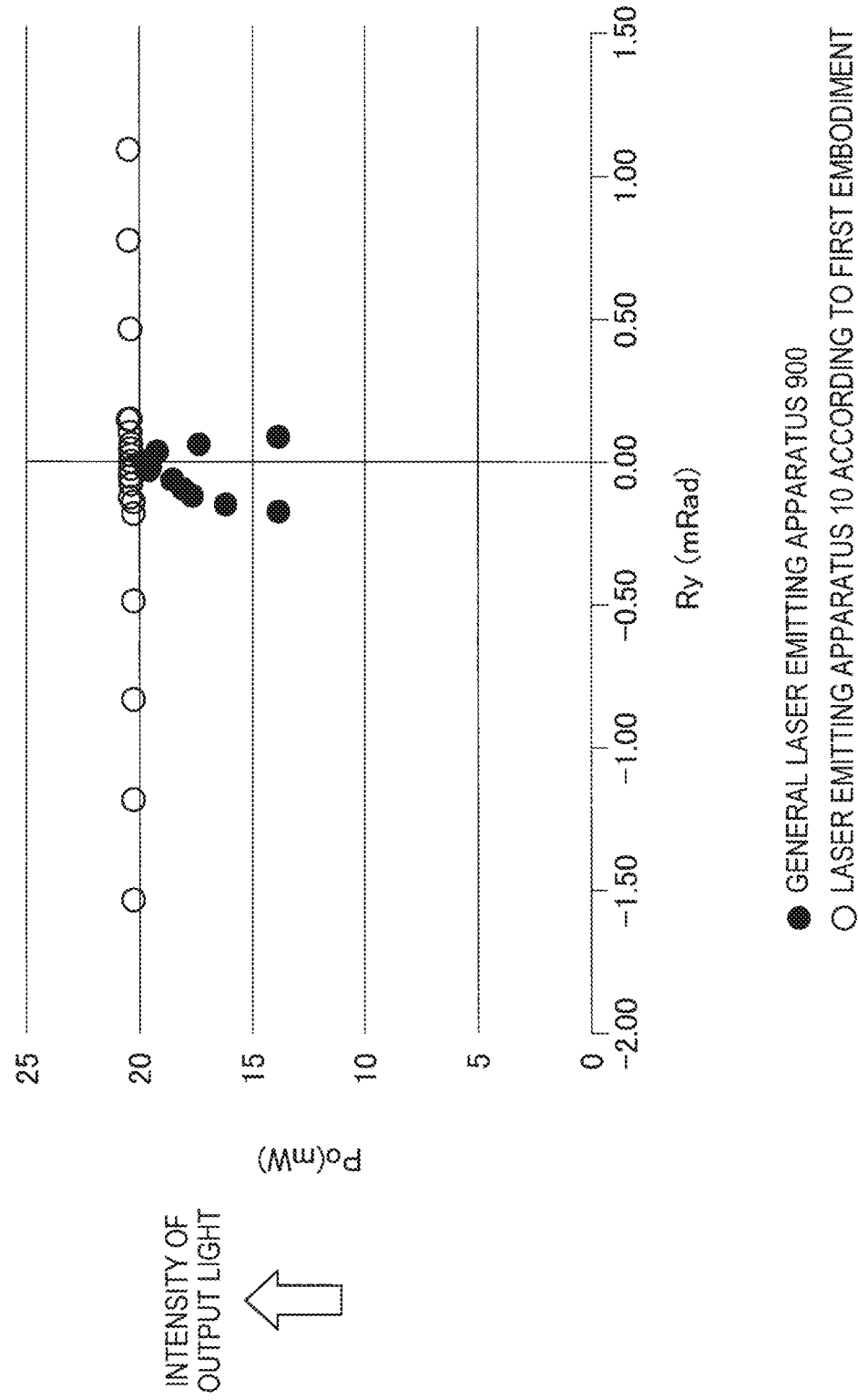
FIG. 5A is a graph showing the intensity of output light from the laser emitting apparatus according to the first embodiment of the present disclosure and the general Littrow external resonator laser emitting apparatus.
Figure 5B:
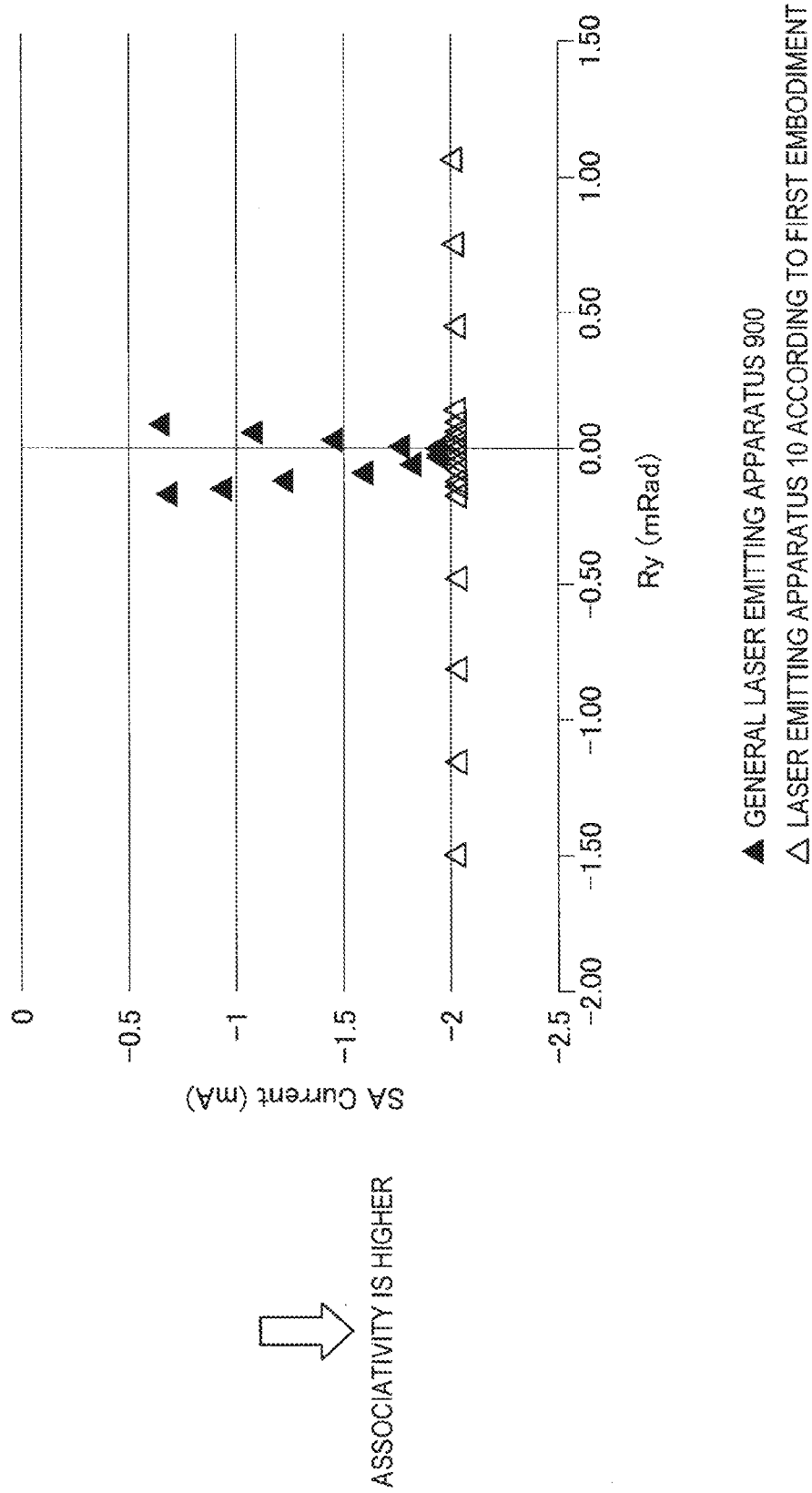
FIG. 5B is a graph showing the light density in SA portions of the laser emitting apparatus according to the first embodiment of the present disclosure and the general Littrow external resonator laser emitting apparatus.

Next, effects of the laser emitting apparatus 10 according to the first embodiment of the present disclosure will be described with reference to FIG. 5A and FIG. 5B. FIG. 5A is a graph showing the intensity of the output light from the laser emitting apparatus 10 according to the first embodiment of the present disclosure and the general Littrow external resonator laser emitting apparatus 900. FIG. 5B is a graph showing the light density in SA portions of the laser emitting apparatus 10 according to the first embodiment of the present disclosure and the general Littrow external resonator laser emitting apparatus 900. Note that when data shown in FIG. 5A and FIG. 5B were obtained, a laser diode having the same structure as the laser diode 110 was used as the laser light source of the Littrow external resonator laser emitting apparatus 900, so that the intensity of the output light and the light density in the SA portions were evaluated.

In FIG. 5A, the horizontal axis represents the inclination angle dRy (mRad) of the gratings 130 and 930 with respect to the z-axis on the y-z plane in FIG. 1A, FIG. 1B, FIG. 3A, and FIG. 3B. In addition, the vertical axis represents intensity Po (mW) of the output light from the laser emitting apparatus 10 according to the first embodiment and the general Littrow external resonator laser emitting apparatus 900. In FIG. 5A, the larger the value of the vertical axis, the higher the intensity of the output light is.

Further, in FIG. 5B, the horizontal axis represents the inclination angle dRy (mRad) of the gratings 130 and 930 as in FIG. 5A, and the vertical axis represents SA current values (mA), which are current values of the SA portions in the laser diodes 110 and 910 of the laser emitting apparatus 10 according to the first embodiment and the general Littrow external resonator laser emitting apparatus 900. As described above, by the current value of the SA portion of the laser diode 110, the light density in the SA portion and the intensity of resonance in laser oscillation can be evaluated. In FIG. 5B, the smaller the value of the vertical axis (the smaller the current value), the higher the light density and the degree of resonance (degree of association) in the resonator is.

Note that the data shown in FIG. 5A and FIG. 5B were obtained in the following conditions: the gratings 130 and 930 each having a diffraction density of 3900 (line/mm) were used; and the wavelength of the output light from the laser emitting apparatus 10 and the Littrow external resonator laser emitting apparatus 900 was set to 405 nm. At this time, in order to control the wavelength of the first-order diffracted light to be returned to the laser diode 110 from the gratings 130 and 930, according to Brag's law, the disposition angle Rx of each of the gratings 130 and 930 was set to be approximately equal to 0.82 (Rad). (0.82 (Rad) is approximately equal to 47 (deg).) Further, the collimator lenses 120 and 920 in the laser emitting apparatus 10 and the Littrow external resonator laser emitting apparatus 900 each have a focal length f of f=4.02 mm, and the cylindrical lens 140 in the laser emitting apparatus 10 has a focal length f of f=70 mm. Furthermore, driving conditions of the laser diodes 110 and 910 are $V_{SA}=0$ (V) (i.e., CW laser), and $I_{gain}=60$ (mA).

Referring to FIG. 5A and FIG. B, in the general Littrow external resonator laser emitting apparatus 900, it is found that even a slight change in Ry decreases the intensity Po and increases the SA current. This is considered to be because the change in Ry decreases the ratio of light returned to the light spot 915 to light returned to the laser diode 910 from the grating 930, resulting in the decrease in resonance efficiency.

On the other hand, referring to FIG. 5A and FIG. 5B, in the laser emitting apparatus 10 according to the first embodiment, even when Ry is changed, almost constant values of the intensity Po and the SA current are maintained. In this manner, in the laser emitting apparatus 10, a larger tolerance to the change in Ry is obtained than in the Littrow external resonator laser emitting apparatus 900. This is considered to be because, as described above, by providing the cylindrical lens 140 in the laser emitting apparatus 10, the confocal points are formed on the light emitting surface of the laser diode 110 and the reflection surface of the grating 130, and accordingly, even when Ry is changed, the emitted light from the laser diode 110 is resonated between the focal point f1 on the reflection surface of the grating 130 and the focal point f2 on the light-emitting surface of the laser diode 110, and the decrease in resonance efficiency is suppressed.

The first embodiment of the present disclosure has been described above with reference to FIG. 3A, FIG. 3B, FIG. 4, FIG. 5A, and FIG. 5B. As described above, according to the first embodiment, by providing the cylindrical lens 140, the confocal points are formed on the light emitting surface of the laser diode 110 and the reflection surface of the grating 130. Therefore, the emitted light from the laser diode 110 is resonated more reliably between the focal point f1 on the reflection surface of the grating 130 and the focal point f2 on the light emitting surface of the laser diode 110, and accordingly, it is possible to secure the tolerance to the change in the disposition angle Ry of the grating 130 and to suppress the decrease in resonance efficiency. Further, in the first embodiment, since the cylindrical lens 140 is used instead of a spherical lens in order to provide the confocal points, light is incident with the predetermined expanse (width) with respect to the arrangement direction of the grooves on the grating 130 and the wavelength selectivity is secured. Therefore, it is possible to secure the wavelength selectivity and to suppress the decrease in resonance efficiency due to dRy.

Note that although FIG. 5A and FIG. 5B show the results of using the CW laser, in which $V_{SA}=0$ (V) in the laser diodes 110 and 910, a similar result is obtained when using pulsed laser.

Further, in the above description, as illustrated in FIG. 3A and FIG. 3B, a lens system between the laser diode 110 and the grating 130 is formed by the collimator lens 120 and the cylindrical lens 140; however, the structure of the lens system in the first embodiment is not limited to this example. In the first embodiment, there is no limitation on the type and number of lenses provided between the laser diode 110 and the grating 130, and any lens structure may be used as long as a light path is formed such that the light is incident with the predetermined width D1 with respect to the arrangement direction of the grooves on the x-z plane and the confocal points are formed on the light emitting surface of the laser diode 110 and the reflection surface of the grating 130, on the y-z plane.

<3. Second Embodiment>

Next, a second embodiment of the present disclosure will be described. In the second embodiment of the present disclosure, a relay lens is further provided with respect to the first embodiment described above. In a description of the second embodiment below, in order to make effects of the second embodiment clearer, an introduction of the relay lens to a laser emitting apparatus will be discussed by taking a case where spherical lenses are used as the relay lens as an example. Next, as the second embodiment of the present disclosure, a laser emitting apparatus in which cylindrical lenses are provided as the relay lens will be described.

(3-1. Discussion on Relay Lens)

Figure 6A:
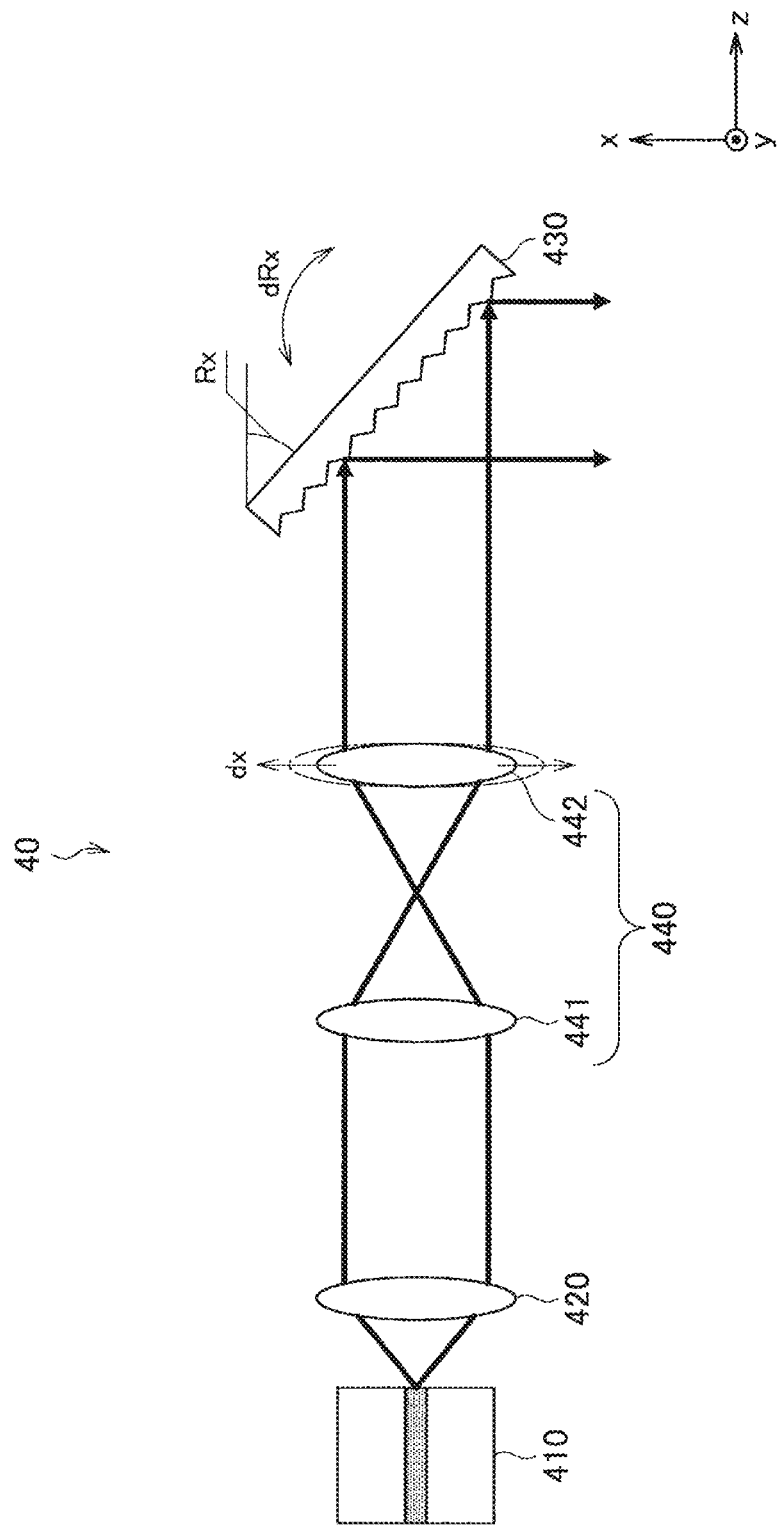
FIG. 6A is a top view illustrating a structure example of a laser emitting apparatus to which spherical lenses are introduced as a relay lens.
Figure 6B:
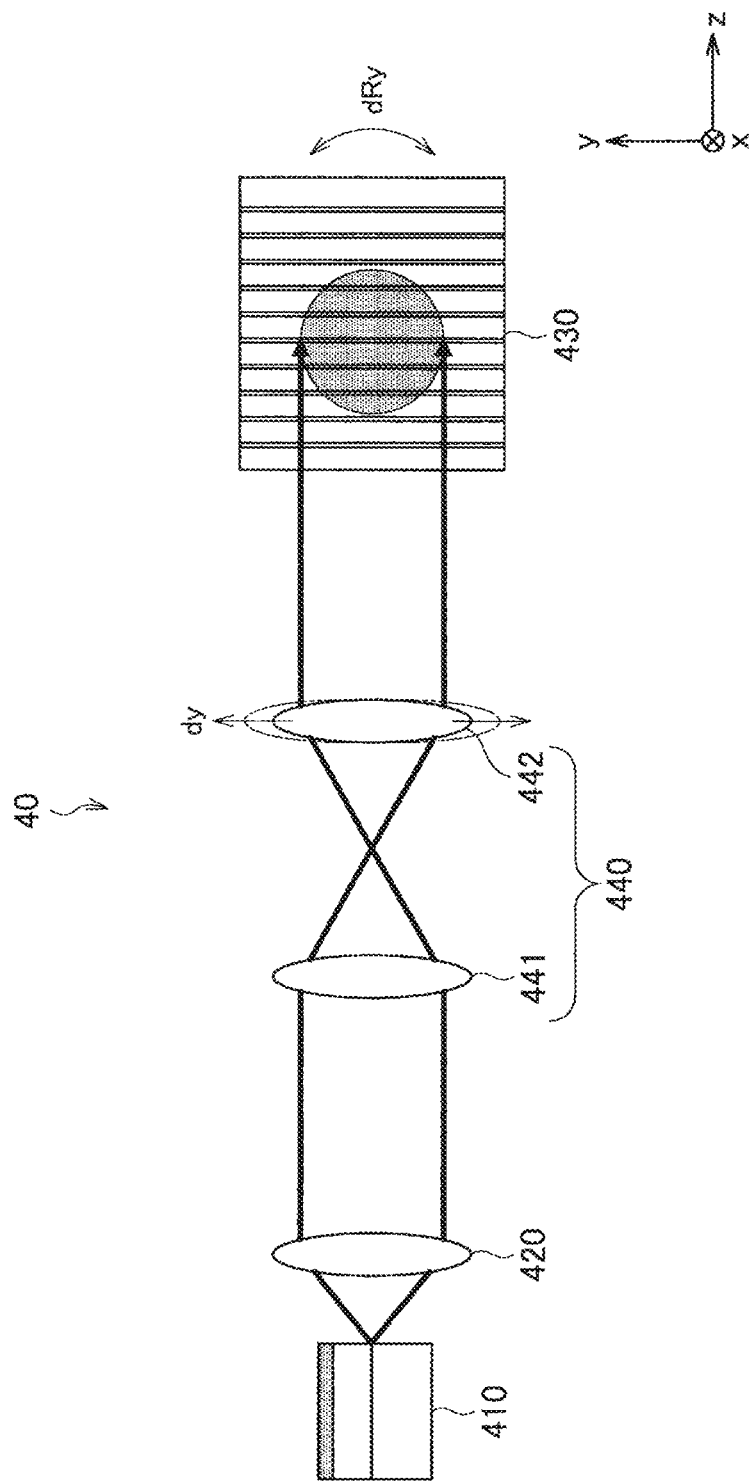
FIG. 6B is a side view illustrating the structure example of the laser emitting apparatus to which the spherical lenses are introduced as the relay lens.

First, a schematic structure of the laser emitting apparatus to which the spherical lenses are introduced as the relay lens will be described with reference to FIG. 6A and FIG. 6B. FIG. 6A is a top view showing a structure example of the laser emitting apparatus to which the spherical lenses are introduced as the relay lens. FIG. 6B is a side view showing the structure example of the laser emitting apparatus to which the spherical lenses are introduced as the relay lens.

Referring to FIG. 6A and FIG. 6B, a laser emitting apparatus 40 to which the spherical lenses are introduced as the relay lens includes a laser diode 410, a collimator lens 420, a grating 430, and a relay lens 440. As illustrated in FIG. 6A and FIG. 6B, a structure of the laser emitting apparatus 40 corresponds to a structure in which the relay lens 440 is further provided in the structure of the Littrow external resonator laser emitting apparatus 900 illustrated in FIG. 1A and FIG. 1B. Here, the laser diode 410, the collimator lens 420, and the grating 430 have the same functions and structures as the laser diodes 110 and 910, the collimator lenses 120 and 920, and the gratings 130 and 930 described with reference to FIG. 1A, FIG. 1B, FIG. 3A, and FIG. 3B, and therefore a detailed description thereof is omitted.

The relay lens 440 includes spherical lenses 441 and 442. In the laser emitting apparatus 40, emitted light from the laser diode 410 passes through the collimator lens 420 and the spherical lenses 441 and 442 and is incident on the grating 430. By providing the pair of spherical lenses 441 and 442 as the relay lens 440, as illustrated in FIG. 6A and FIG. 6B, generally parallel light can be incident on the grating 430.

Figure 8:
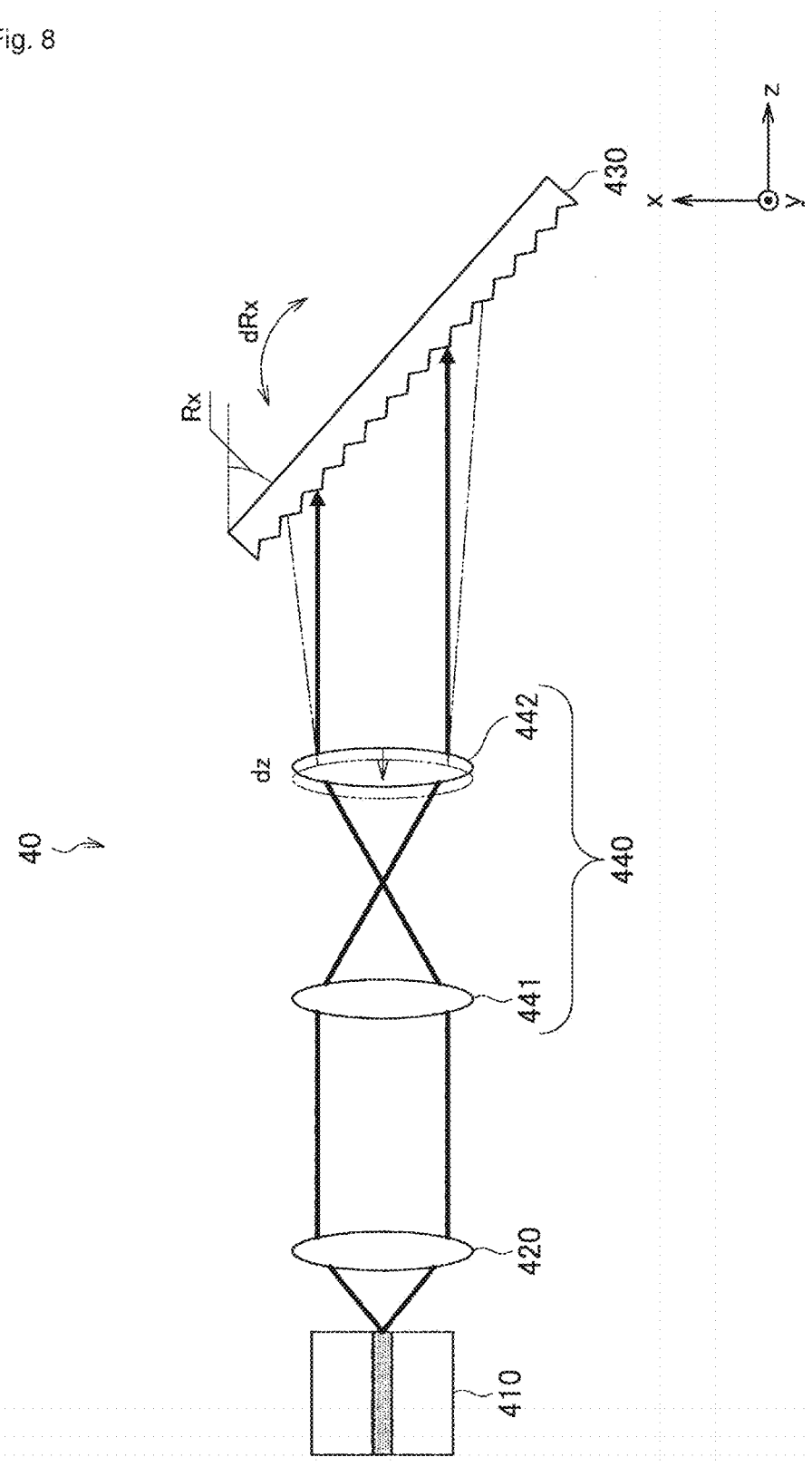
FIG. 8 is a top view illustrating a state in which the position of the relay lens is changed in a z-axis direction in the laser emitting apparatus.

In the laser emitting apparatus 440 including such a relay lens, by changing the position of the relay lens 440 in any of the x-axis, y-axis, and z-axis directions (change amounts in the respective directions are referred to as dx, dy, and dz, respectively, as illustrated in FIG. 6A, FIG. 6B, and FIG. 8), the following effects can be obtained.

For example, by adjusting the position of the spherical lens 442 positioned in a latter part of the relay lens 440 in the x-axis direction, the inclination of an optical axis in the x-axis direction can be controlled. That is, by moving the position of the spherical lens 442 in the x-axis direction by dx, it is possible to adjust the incident angle of the incident light with respect to the arrangement direction of the grooves on the grating 430 and the incident position of light to be returned to the laser diode 410 in the x-axis direction.

Further, for example, by adjusting the position of the spherical lens 442 in the latter part of the relay lens 440 in the y-axis direction, the inclination of the optical axis in the y-axis direction can be controlled. That is, by changing the position of the spherical lens 442 in the y-axis direction by dy, it is possible to adjust the incident angle of the incident light on the stretching direction of the grooves on the grating 430 and the incident position of the light to be returned to the laser diode 410 in the y-axis direction.

Note that although the case where the position of the spherical lens 442 positioned in the latter part of the relay lens 440 is changed in the x-axis and y-axis directions is shown above, in a case of adjusting the optical axis, the position of the spherical lens 441 positioned in the former part may also be changed in the x-axis and y-axis directions. That is, by adjusting at least one of the positions of the spherical lenses 441 and 442 included in the relay lens 440 in the x-axis and y-axis directions, the inclination of the optical axis may be adjusted.

Figure 7:
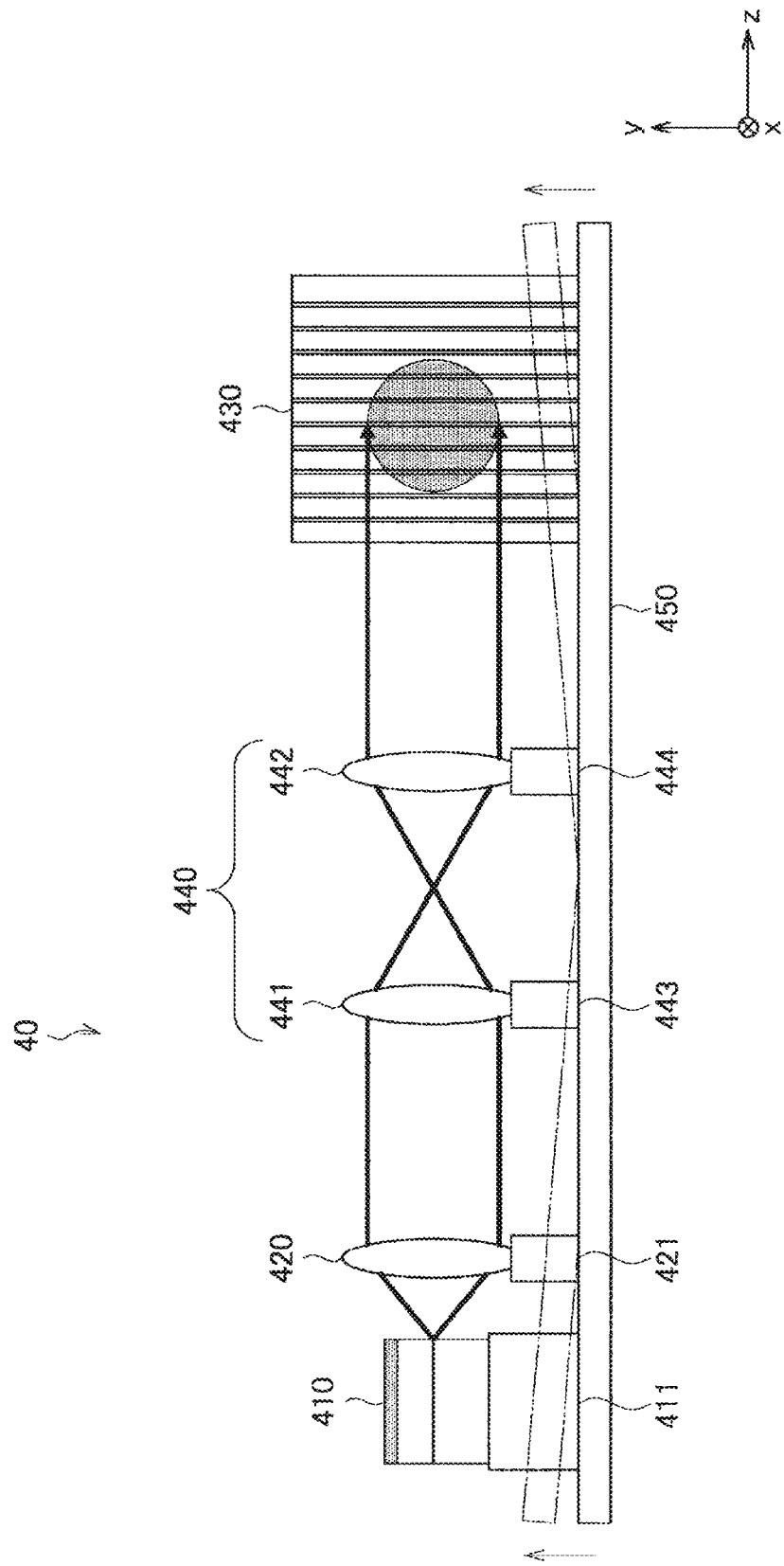
FIG. 7 is a view for explaining correction effects of a shift of an optical axis by the relay lens in the laser emitting apparatus.

In the above manner, by introducing the relay lens 440, it is possible to correct a shift of the optical axis more easily in the laser emitting apparatus 40. Such correction effects of the shift of the optical axis by the relay lens 440 in the laser emitting apparatus 40 will be described with reference to FIG. 7. FIG. 7 is a view for explaining the correction effects of the shift of the optical axis by the relay lens 440 in the laser emitting apparatus 40. FIG. 7 is a side view schematically illustrating a state where the laser emitting apparatus 40 is installed over a base. Referring to FIG. 7, over a base 450, a laser diode support base 41, a collimator lens support base 421, and relay lens support bases 443 and 444 are provided. Further, the laser diode support base 441, the collimator lens support base 421, and the relay lens support bases 443 and 444 support the laser diode 410, the collimator lens 420, and the spherical lenses 441 and 442, respectively.

Here, as described in <1. Discussion on general external resonator laser emitting apparatus> above, in the laser emitting apparatus 40, the optical axis (optical relative position relation between structure members) might be slightly changed by a change in ambient temperature or distortion at the time of the composition of the apparatus, by aging, or the like. For example, on the assumption that the laser emitting apparatus 40 is actually installed over a certain base as illustrated in FIG. 7, the base itself might be distorted by a mechanical distortion due to the change in ambient temperature, aging, or the like, for example.

Here, as indicated by arrows in FIG. 7, on the assumption that both ends of the base 450 are warped upward (in the positive direction of the y-axis direction) by a certain reason, the relative position relation between the laser diode 410 and the grating 430 is changed and the optical axis shifts from the predetermined position. When such a change is generated without intention in the relative position relation between the laser diode 410 and the grating 430, the wavelength and intensity of the output light might change, desired output light might fail to be obtained stably, and reliability of the laser emitting apparatus 40 might be decreased. Although attention is paid only to the warping in the base 450 in FIG. 7, such distortion might be generated similarly in the laser diode support base 411, the collimator lens support base 421, and the relay lens support bases 443 and 444.

Here, as described above, the laser emitting apparatus 40 has a function of adjusting the inclination (distortion) of the optical axis by the relay lens 440. Accordingly, by adjusting the position of the relay lens 440 in the x-axis and y-axis directions, the shift of the optical axis due to a distortion of the base 450, the laser diode support base 441, the collimator lens support base 421, and the relay lens support bases 443 and 444 can be adjusted. Accordingly, for example, by adjusting the optical axis by the relay lens 440 when the laser emitting apparatus 40 is used, it is possible to obtain more stable output and to perform measurement and observation more accurately.

Also in a case where the laser emitting apparatus 40 is newly installed, first, by determining the positions of the laser diode 410, the collimator lens 420, and the grating 430, and then by installing the relay lens 440, the optical axis can be adjusted more easily. Changing the position of the relay lens 440 is much easier than changing the positions of the laser diode 410 and the grating 430, and therefore high convenience can be offered to a user.

As described above, by providing the relay lens 440, the optical axis can be adjusted easily.

Further, in a case where the laser emitting apparatus 40 outputs pulsed laser, as illustrated in FIG. 8, by adjusting the change dz in the position of the spherical lens 442 positioned in the latter part of the relay lens 440 in the z-axis direction, chromatic dispersion of the pulsed laser can be controlled. FIG. 8 is a top view illustrating a state where the position of the relay lens 440 is changed in the z-axis direction in the laser emitting apparatus 40 illustrated in FIG. 6A and FIG. 6B.

FIG. 8 illustrates changes in light paths in the laser emitting apparatus 40 when the spherical lens 442 positioned in the latter part of the relay lens 440 is moved in the direction of the laser diode 410 (negative direction of the z-axis direction) by dz. As illustrated in FIG. 8, by moving the spherical lens 442 by dz, light paths indicted by solid lines between the spherical lens 442 and the grating 430 are changed to light paths indicated by dotted lines, depending on the wavelength. In the example illustrated in FIG. 8, out of light toward the grating 430 from the spherical lens 442, light of a relatively long wavelength (long wavelength light) is transmitted along a longer light path, and light of a relatively short wavelength (short wavelength light) is transmitted along a shorter light path. Therefore, wavelengths of light to be resonated differ, resulting in chromatic dispersion of the output light from the laser emitting apparatus 40.

Note that although the case where the position of the spherical lens 442 positioned in the latter part of the relay lens 440 is changed in the z-axis direction has been described above, in a case of controlling the chromatic dispersion, the position of the spherical lens 441 positioned in a former part may also be changed in the z-axis direction.

That is, by adjusting at least one of the positions of the spherical lenses 441 and 442 included in the relay lens 440 in the z-axis direction, the chromatic dispersion may be controlled.

Figure 9A:
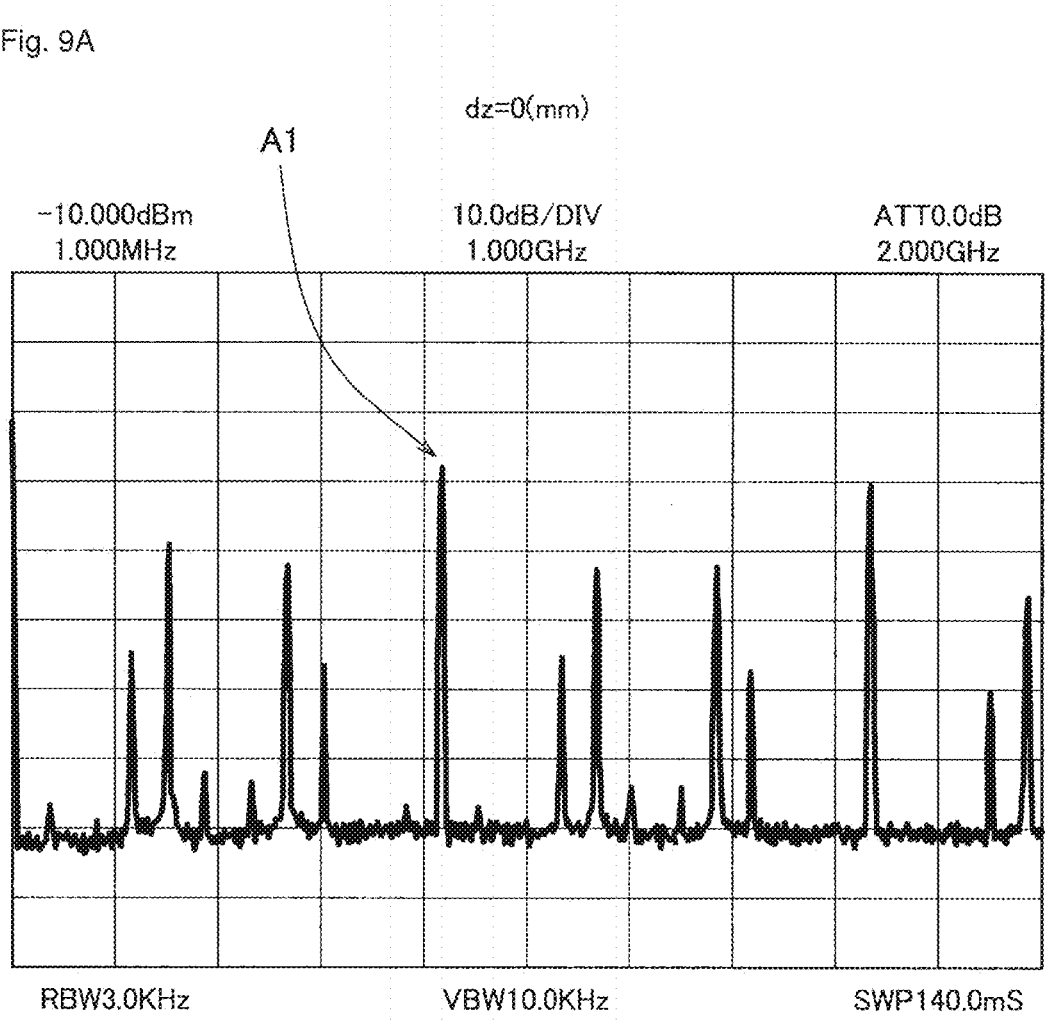
FIG. 9A is a graph showing spectra of output light from the laser emitting apparatus.

Effects obtained by changing the position of the spherical lens 442 positioned in the latter part of the relay lens 440 in the laser emitting apparatus 40 in the z-axis direction (optical axis direction) in the above manner will be described with reference to FIG. 9A and FIG. 9B. FIG. 9A and FIG. 9B are each a graph showing spectra of the output light from the laser emitting apparatus 40 illustrated in FIG. 6A and FIG. 6B. FIG. 9A is a graph showing the spectra of the output light when dz=0 mm, that is, when the spherical lens 442 is in the predetermined position. FIG. 9B is a graph showing the spectra of the output light when the position of the spherical lens 442 is moved by dz=−2 mm. Note that driving conditions of the laser diode 410 in FIG. 9A are $V_{SA}$=−9 (V) and $I_{gain}$=55 (mA), and driving conditions of the laser diode 410 in FIG. 9B are $V_{SA}$=−9 (V) and $I_{gain}$=62 (mA). Further, when the data shown in FIG. 9A and FIG. 9B were obtained, a collimator lens and spherical lenses having a focal length f of f=4.02 mm, f=80 mm, and f=40 mm were used as the collimator lens 420 and the spherical lenses 441 and 442 in the laser emitting apparatus 40, respectively.

In each of FIG. 9A and FIG. 9B, spectra of the output light from the laser emitting apparatus 40 is plotted with the horizontal axis representing the frequency of the output light and the vertical axis representing the intensity of the output light. Referring to FIG. 9A and FIG. 9B, by changing the position of the spherical lens 442 from dz=0 mm to dz=−2 mm, components other than predetermined spectra are found to be reduced. For example, a spectrum A1 shown in FIG. 9A and FIG. 9B is the output light corresponding to a frequency of approximately 850 (MHz), and other spectra around the spectrum A1 are reduced in accordance with the change in the position of the spherical lens 442. This means that pulsed light of predetermined frequency components with fewer noises can be obtained as the output light from the laser emitting apparatus 40. In this manner, by adjusting the position of the relay lens 440 in the optical axis direction, noise components of the pulsed light, which is the output light from the laser emitting apparatus 40, can be reduced. One of reasons for generating such effects is considered to be that, as described with reference to FIG. 8, by changing the position of the relay lens 440 in the optical axis direction, the light paths of the incident light on the grating 430 are changed depending on the wavelength and chromatic dispersion (frequency dispersion) effects can be obtained.

The schematic structure of the laser emitting apparatus 40 to which the spherical lenses are introduced as the relay lens has been described above with reference to FIG. 6A and FIG. 6B. Further, the effects of introducing the relay lens to the laser emitting apparatus 40 have been described with reference to FIG. 7, FIG. 8, FIG. 9A, and FIG. 9B.

Figure 10:
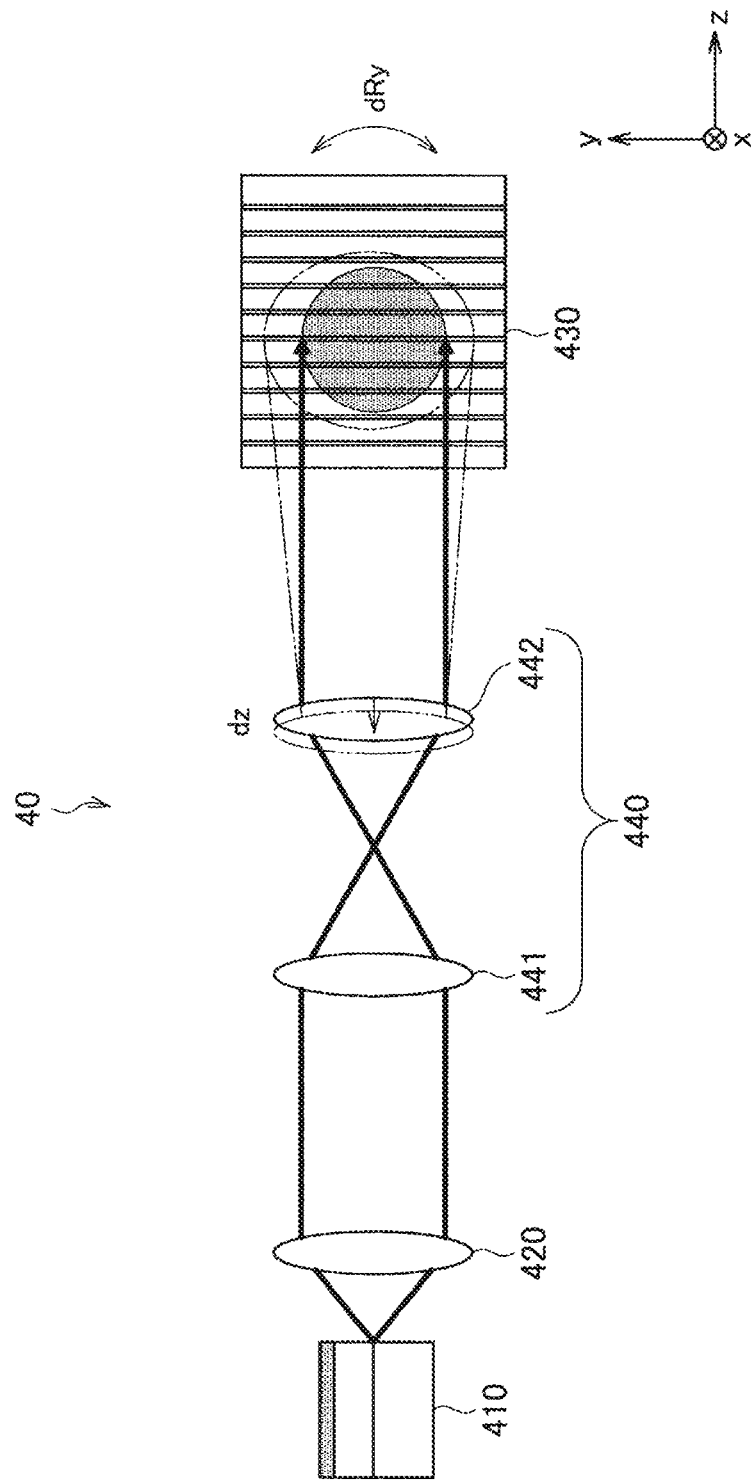
FIG. 10 is a side view illustrating a state in which the position of the relay lens is changed in the z-axis direction in the laser emitting apparatus.

On the other hand, when the relay lens 440 is moved in the z-axis direction as illustrated in FIG. 8, the spectra of the output light is improved but there are the following concerns. That is, as illustrated in FIG. 10 for example, by changing the incident angle on the grating 430 according to the change in the position of the relay lens 440 in the z-axis direction, the ratio of light to be returned to the laser diode 410 might be decreased and the resonance efficiency might be decreased. FIG. 10 is a side view illustrating a state where the position of the relay lens 440 in the laser emitting apparatus 40 illustrated in FIG. 6A and FIG. 6B is changed in the z-axis direction. Here, FIG. 10 is a side view corresponding to the top view of the laser emitting apparatus 40 illustrated in FIG. 8.

As illustrated in FIG. 10, by changing the position of the spherical lens 442 positioned in the latter part of the relay lens 440 by dz to the negative direction of the z-axis, a region to be irradiated with light (light irradiation region) on the grating 430 is changed. The optical system of the laser emitting apparatus 40 is designed such that the light incident on the grating 430 is returned to the laser diode 410 and the resonator is formed in a state where dz=0 (mm), that is, in a state where the spherical lens 442 is not moved in the z-axis direction. Therefore, light in a portion where the light irradiation region is changed (e.g., a part by which the area of the light irradiation region is increased in FIG. 10) might not be returned to the laser diode 410 and be a loss component that disperses from the resonator. Such a loss might decrease the resonance efficiency in the resonator.

Figure 11:
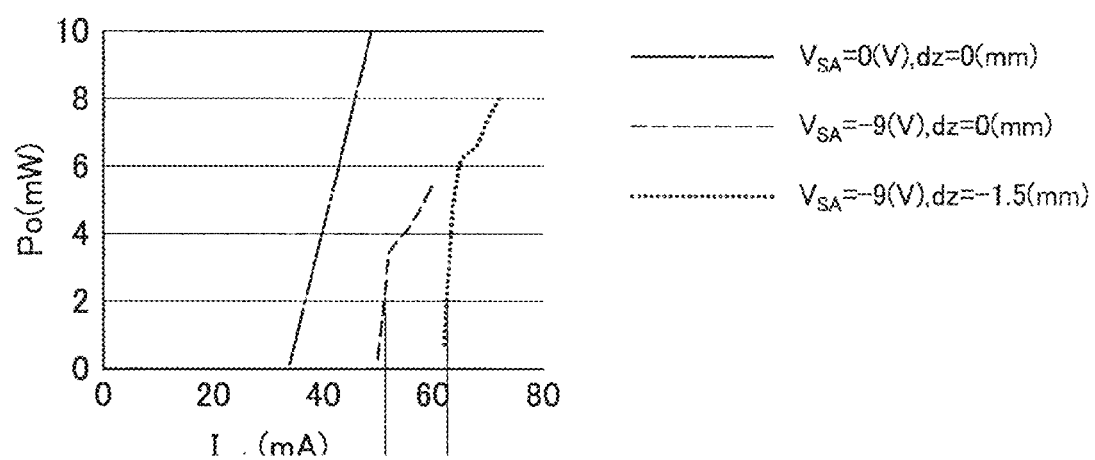
FIG. 11 is a graph showing a change in mode-locked oscillation threshold value of the laser emitting apparatus.

In order to confirm this, the mode-locked oscillation threshold value in the laser emitting apparatus 40 is considered. FIG. 11 is a graph showing a change in the mode-locked oscillation threshold value of the laser emitting apparatus 40.

In FIG. 11, the horizontal axis represents the current $I_{gain}$ (mA) applied to the gain portion of the laser diode 410, and the vertical axis represents the intensity Po (mW) of the output light from the laser emitting apparatus 40. Further, a relation between the intensity Po and the current $I_{gain}$ at the time when the voltage $V_{SA}$ applied to the SA portion of the laser diode 410 and the position of the spherical lens 442 in the z-axis direction are changed is plotted.

First, when ($V_{SA}$=0 (V), dz=0 (mm)), the intensity Po and the current $I_{gain}$ has a relation represented by an almost straight line. Next, by changing conditions to ($V_{SA}$=−9 (V), dz=0 (mm)), as illustrated in FIG. 11, the graph shifts to the right. This shows that when the value of the voltage $V_{SA}$ is changed from 0 (V) to −9 (V), that is, when the emitted light from the laser diode 410 is changed from the CW laser to the pulsed laser, in order to obtain the same intensity Po of the output light, higher current $I_{gain}$ is necessary.

Here, by further changing conditions to ($V_{SA}$=−9 (V), dz=−1.5 (mm)), as illustrated in FIG. 11, the graph further shifts to the right. In this manner, by changing the position of the spherical lens 442 in the z-axis direction from dz=0 (mm) to dz=−1.5 (mm), the value of the current $I_{gain}$ that is necessary to obtain the same intensity Po of the output light is further increased. That is, the mode-locked oscillation threshold value is increased.

From the above, as shown in FIG. 11, by the change dz in the position of the spherical lens 442 in the z-axis direction, in order to obtain desired output from the laser emitting apparatus 40, it is found that a higher current value as the current $I_{gain}$ is necessary. This is considered to be because, as described with reference to FIG. 10, the change dz in the position of the spherical lens 442 generates the loss in the resonator formed between the laser diode 410 and the grating 430.

As described above, by introducing the relay lens to the laser emitting apparatus, the following effects can be obtained. That is, with respect to the x-axis and y-axis directions, by adjusting the position of the relay lens in the x-axis and y-axis directions, the optical axis can be adjusted easily. Further, with respect to the z-axis direction (optical axis direction), by adjusting the position of the relay lens in the z-axis direction, chromic dispersion effects of can be generated and noises of the output light can be reduced.

On the other hand, as illustrated in FIG. 11, it is found that the change in the position of the relay lens in the z-axis direction in order to reduce noises of the output light increases the mode-locked oscillation threshold value. In order to suppress such an increase in mode-locked oscillation threshold value, it is necessary to suppress an increase in loss in the resonator in accordance with the change in the position of the relay lens in the z-axis direction.

The present inventors have discussed how to decrease noises of the output light with the increase in loss in the resonator suppressed and have reached the following second embodiment of the present disclosure. The second embodiment will be described in detail below.

(3-2. Schematic Structure of Laser Emitting Apparatus According to the Second Embodiment)

Figure 12A:
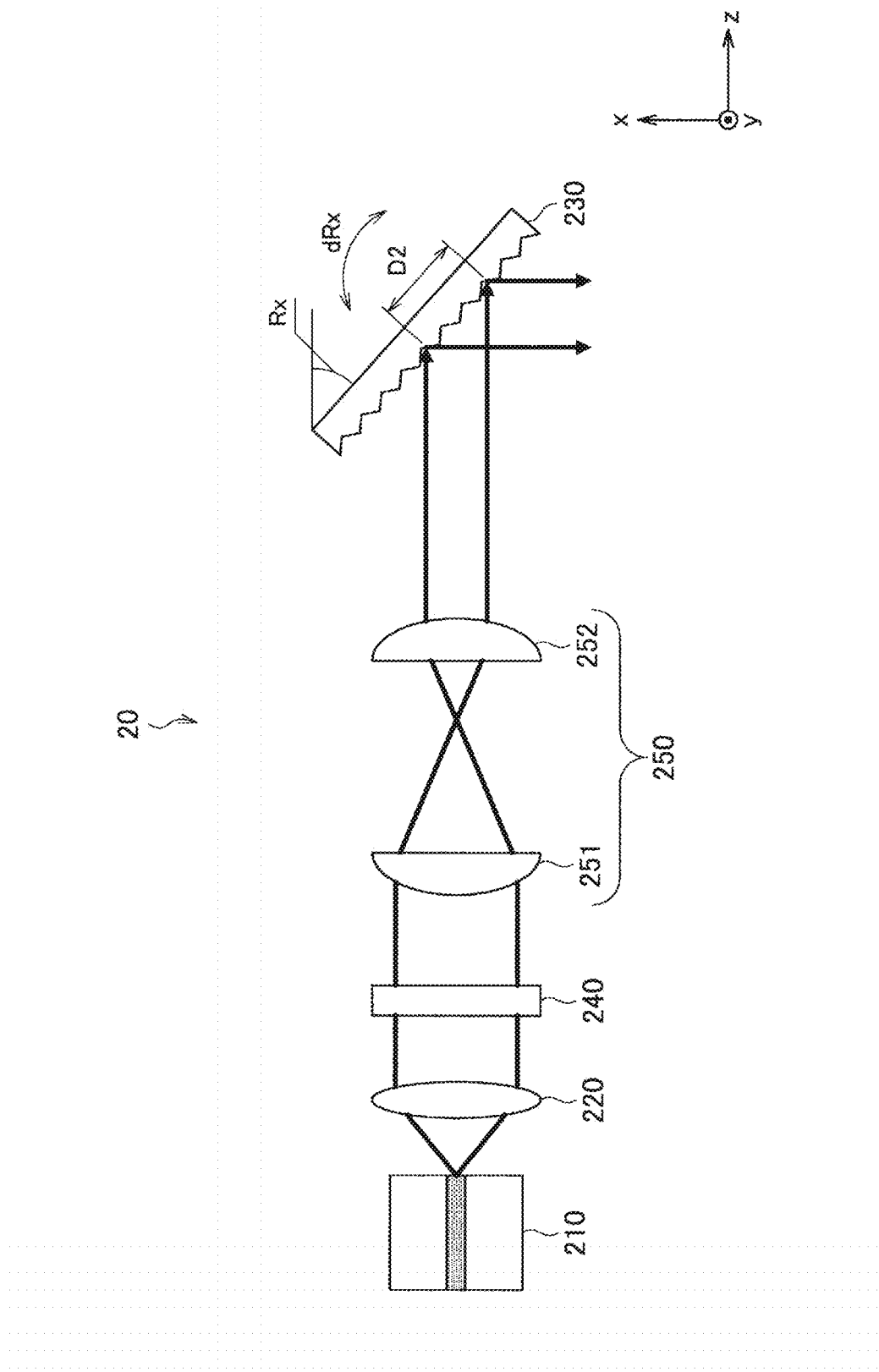
FIG. 12A is a top view illustrating a structure example of a laser emitting apparatus according to a second embodiment of the present disclosure.
Figure 12B:
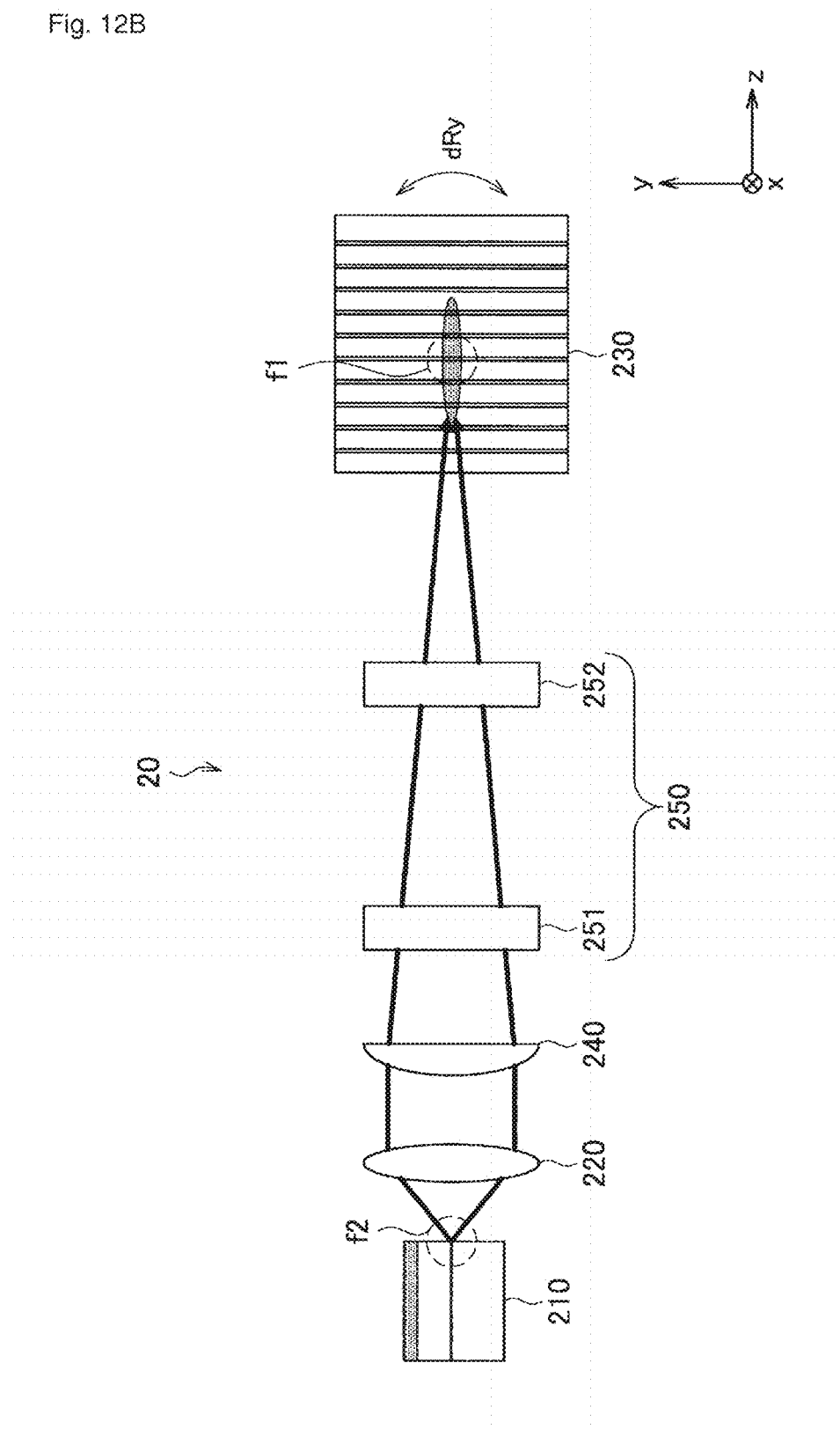
FIG. 12B is a side view illustrating the structure example of the laser emitting apparatus according to the second embodiment of the present disclosure.

A schematic structure of a laser emitting apparatus according to the second embodiment of the present disclosure will be described with reference to FIG. 12A and FIG. 12B. FIG. 12A is a top view illustrating a structure example of the laser emitting apparatus according to the second embodiment of the present disclosure. FIG. 12B is a side view illustrating the structure example of the laser emitting apparatus according to the second embodiment of the present disclosure.

Referring to FIG. 12A and FIG. 12B, a laser emitting apparatus 20 according to the second embodiment of the present disclosure includes a laser diode 210, a collimator lens 220, a grating 230, a cylindrical lens 240, and a relay lens 250. Here, the laser diode 210, the collimator lens 220, the grating 230, and the cylindrical lens 240 have the same functions and structures as the laser diode 110, the collimator lens 120, the grating 130, and the cylindrical lens 140 in the laser emitting apparatus 10 according to the first embodiment. That is, a structure of the laser emitting apparatus 20 corresponds to a structure in which the relay lens 250 is further provided in the laser emitting apparatus 10 according to the first embodiment. Therefore, in the following description of the second embodiment, a detailed description of structures overlapping with the first embodiment is omitted, and the relay lens 250, which is a difference from the first embodiment, will be mainly described.

The relay lens 250 includes a pair of cylindrical lenses 251 and 252. In the laser emitting apparatus 20, the emitted light from the laser diode 210 passes through the collimator lens 220, the cylindrical lens 240, and the cylindrical lenses 251 and 252 and is incident on the grating 230. Here, the relay lens 440 of the laser emitting apparatus 40 described in (3-1. Discussion on relay lens) above includes the spherical lenses 441 and 442. In the above manner, the laser emitting apparatus 20 according to the second embodiment corresponds to a structure in which the relay lens 440 formed by the spherical lenses 441 and 442 in the laser emitting apparatus 40 is replaced by the relay lens 250 formed by the cylindrical lenses 251 and 252.

Referring to FIG. 12A, in the second embodiment, the collimator lens 220, the cylindrical lens 240, and the relay lens 250 are provided such that the emitted light from the laser diode 210 is incident on the grating 230 as generally parallel light with a predetermined expanse (width) D2 in the arrangement direction of the grooves on the grating 230 on the x-z plane. Specifically, the cylindrical lenses 251 and 252 are provided so as to function as spherical lenses on the x-z plane, that is, such that the direction having the curvature is the x-axis direction. More specifically, on the x-z plane, the cylindrical lens 251 positioned in the former part is provided such that a cylindrical surface faces the negative direction of the z-axis and the cylindrical lens 252 positioned in the latter part is provided such that a cylindrical surface faces the positive direction of the z-axis direction. By providing the relay lens 250 (cylindrical lenses 251 and 252) in this manner, as illustrated in FIG. 12A, the emitted light from the laser diode 210 is incident with the predetermined expanse (width) D2 with respect to the arrangement direction of the grooves on the grating 230 on the x-z plane.

On the other hand, referring to FIG. 12B, in the second embodiment, the collimator lens 220, the cylindrical lens 240, and the relay lens 250 are provided such that the confocal points are formed on a light emitting surface of the laser diode 210 and a reflection surface of the grating 230, on the y-z plane. Specifically, the cylindrical lenses 251 and 252 are provided so as to function as plane lenses on the y-z plane, that is, such that the direction not having the curvature is generally parallel to the y-axis direction. In the second embodiment, by providing the relay lens 250 (cylindrical lenses 251 and 252) in this manner, an optical system is formed such that, on the x-z plane, the focal point f1 that is one of the confocal points is formed on the reflection surface of the grating 230 and the focal point f2 that is the other of the confocal points is formed at a light spot (light emitting position) of the laser diode 210.

As described above with reference to FIG. 12A and FIG. 12B, by providing the relay lens 250 in the above manner, in the second embodiment, it is possible to obtain the same effects as in the first embodiment. That is, according to the second embodiment, since the confocal points are formed on the light emitting surface of the laser diode 210 and the reflection surface of the grating 230, it is possible to secure the tolerance to the change of the disposition angle Ry of the grating 230 and to suppress the decrease in resonance efficiency. Further, in the second embodiment, light is incident with the predetermined expanse (width) D2 with respect to the arrangement direction of the grooves on the grating 230, so that the wavelength selectivity is secured. Accordingly, it is possible to secure the wavelength selectivity and to suppress the decrease in resonance efficiency due to dRy.

Further, in the second embodiment, by providing the relay lens 250, it is possible to obtain the effects described in (3-1. Discussions on relay lens) above, which are generated by providing the relay lens. That is, according to the second embodiment, by adjusting the position of the relay lens 250 (cylindrical lenses 251 and 252) in the x-axis and y-axis directions, the inclination of the optical axis in the x-axis and y-axis directions can be adjusted. Further, by adjusting the position of the relay lens 250 (cylindrical lenses 251 and 252) in the z-axis direction, the chromatic dispersion of the output light can be controlled.

Furthermore, in the second embodiment, by forming the relay lens 250 by the cylindrical lenses 251 and 252, it is possible to suppress, in controlling the chromatic dispersion, an increase in loss in the resonator and to reduce noises of the output light. Such effects of the second embodiment will be described below.

(3-3. Effects of Laser Emitting Apparatus According to the Second Embodiment)

Figure 13A:
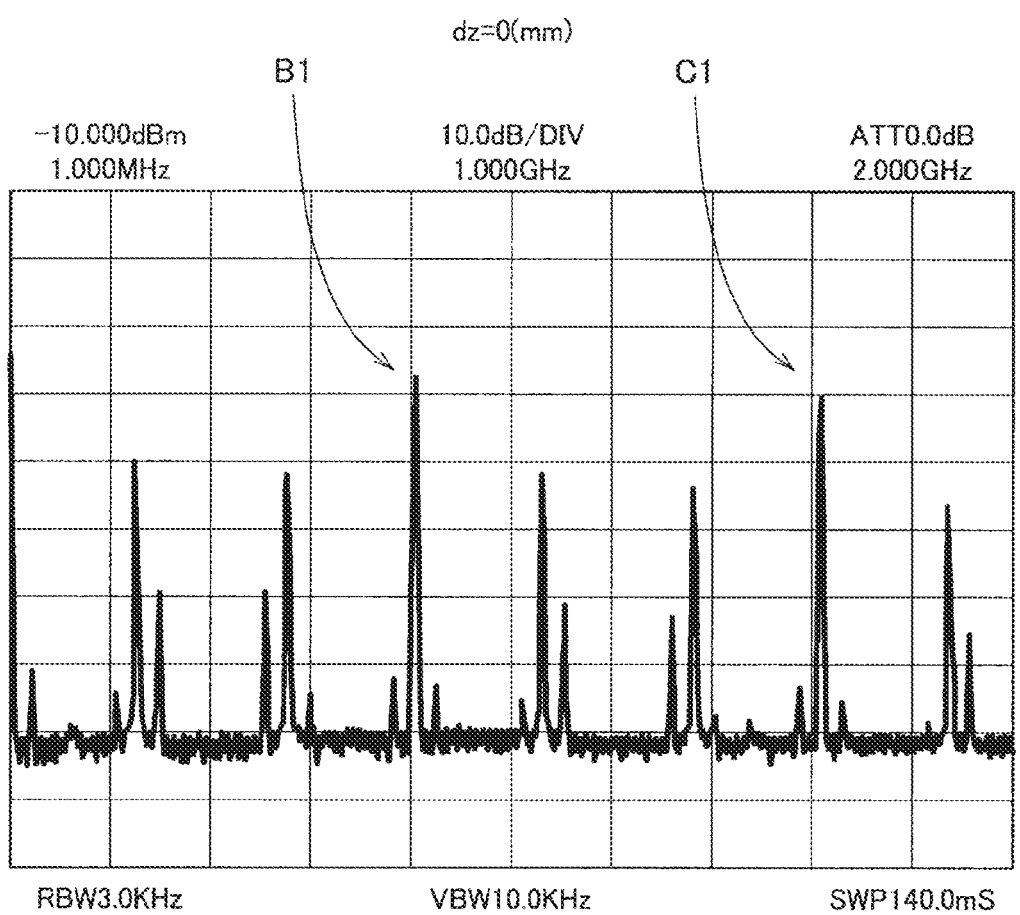
FIG. 13A is a graph showing spectra of output light from the laser emitting apparatus according to the second embodiment of the present disclosure.
Figure 13B:
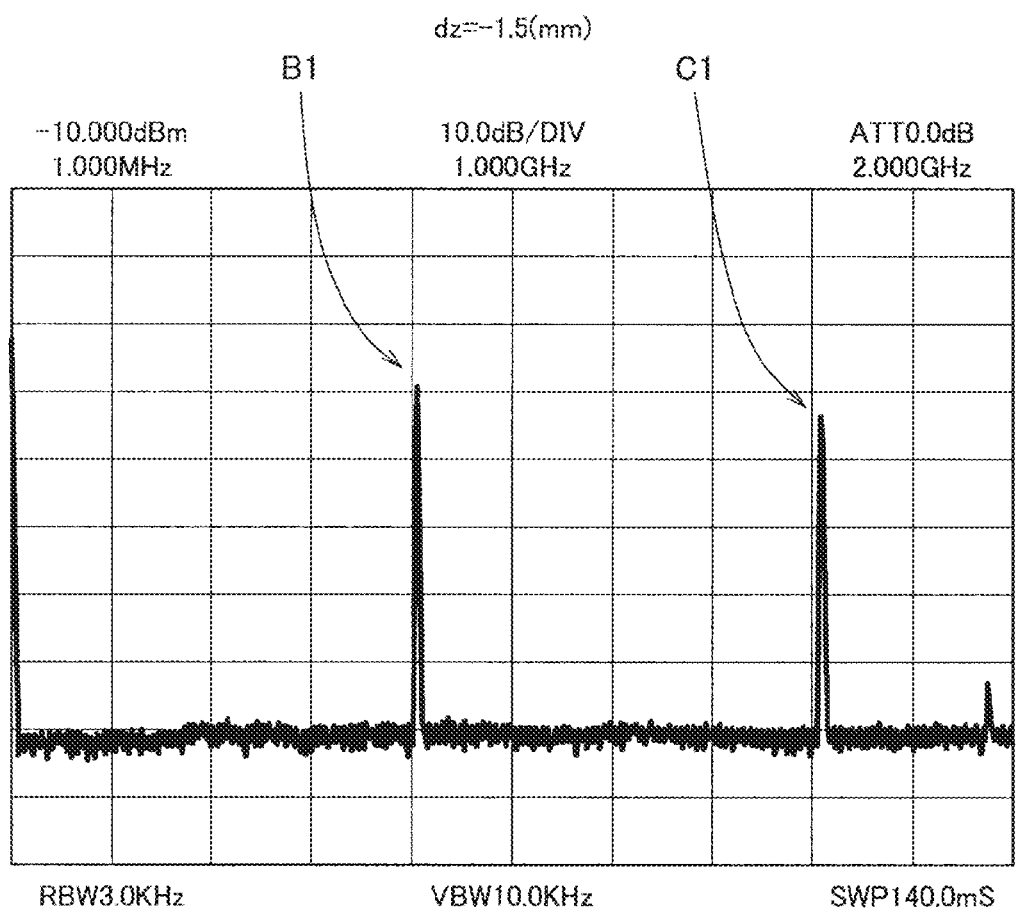
FIG. 13B is a graph showing the spectra of the output light from the laser emitting apparatus according to the second embodiment of the present disclosure.

Effects produced by the laser emitting apparatus 20 according to the second embodiment of the present disclosure will be described with reference to FIG. 13A, FIG. 13B, FIG. 13C, and FIG. 14. FIGS. 13A to 13C are graphs each showing a spectra of the output light from the laser emitting apparatus 20 according to the second embodiment of the present disclosure. FIG. 13A is a graph showing the spectra of the output light when dz=0 mm, that is, when the cylindrical lens 252 positioned in the latter part of the relay les 250 is in a predetermined position. FIG. 13B is a graph showing the spectrum of the output light when the position of the cylindrical lens 252 is moved by dz=−1.5 mm. FIG. 13C is a graph showing the spectra of the output light when the position of the cylindrical lens 252 is moved by dz=−3 mm. Note that the spectra shown in each of FIGS. 13A to 13C were measured in the conditions: the applied voltage $V_{SA}$ to the SA portion of the laser diode 210 is $V_{SA}$=−9 (V). Further, FIG. 13A, FIG. 13B, and FIG. 13C are the graphs when the applied currents $I_{gain}$ to the gain portion of the laser diode 210 are $I_{gain}$=54 (mA), 57 (mA), and 59 (mA), respectively. Note that the horizontal axes and the vertical axes in the graphs shown in FIGS. 13A to 13C mean the same physical quantities as those in the graph shown in FIGS. 9A and 9B.

Referring to FIGS. 13A to 13C, by changing the position of the cylindrical lens 252 from dz=0 mm to dz=−1.5 mm and dz=−3.0 mm, components other than predetermined spectra are found to be reduced. For example, by paying attention to a spectrum B1 and a spectrum C1 in FIGS. 13A to 13C, other spectra around the spectra B1 and C1 are reduced in accordance with the change in the position of the cylindrical lens 252. This means that pulse laser of predetermined frequency components can be obtained with fewer noises as the output light from the laser emitting apparatus 20. In this manner, in the laser emitting apparatus 20, by adjusting the position of the relay lens 250 in the optical axis direction, as in the laser emitting apparatus 40 illustrated in FIG. 6A and FIG. 6B, it is possible to obtain chromatic dispersion (frequency dispersion) effects of the emitted light from the laser diode 210 and to suppress noise components of the pulsed light which is the output light from the laser emitting apparatus 20.

Next, the mode-locked oscillation threshold value of the laser emitting apparatus 20 according to the second embodiment of the present disclosure will be described with reference to FIG. 14. FIG. 14 is a graph showing a change in the mode-locked oscillation threshold value in the laser emitting apparatus 20 according to the second embodiment of the present disclosure. Note that the horizontal axis and the vertical axis in the graph shown in FIG. 14 mean the same physical quantities as those in the graph shown in FIG. 11.

In FIG. 14, a relation between the intensity Po of the output light and the current $I_{gain}$ applied to the gain portion of the laser diode 210 at the time when the voltage $V_{SA}$ applied to the SA portion of the laser diode 210 and the position of the cylindrical lens 252 in the z-axis direction are changed is plotted. Specifically, with respect to the voltage $V_{SA}$ and the change dz in the position of the cylindrical lens 252 in the z-axis direction, the relation between the intensity Po and the current $I_{gain}$ is measured in four conditions: ($V_{SA}$=0 (V), dz=0 (mm)), ($V_{SA}$=−9 (V), dz=0 (mm)), ($V_{SA}$=−9 (V), dz=−1.5 (mm)), and ($V_{SA}$=−9 (V), dz=−3 (mm)).

Referring to FIG. 14, when the condition is changed from ($V_{SA}$=0 (V), dz=0 (mm)) to ($V_{SA}$=−9 (V), dz=0 (mm)), the graph changes in the same manner as in FIG. 11. However, in FIG. 14, when dz is changed, that is, when the condition is changed to ($V_{SA}$=−9 (V), dz=−1.5 (mm)) or ($V_{SA}$=−9 (V), dz=−3 (mm)), the amount of shift to the right of the graph is suppressed to be smaller than in FIG. 11. In this manner, in the second embodiment, the increase in the mode-locked oscillation threshold value due to the change in the position of the cylindrical lens 252 (relay lens) can be made smaller than in the structure of the laser emitting apparatus 40 illustrated in FIG. 6A and FIG. 6B. This is considered to be because the confocal points are formed on the light emitting surface of the laser diode 210 and the reflection surface of the grating 230 by providing the cylindrical lenses 240, 251, and 252 in the second embodiment, and accordingly, even when the position of the cylindrical lens 252 is changed in the z-axis direction, the emitted light passes through the confocal points and is resonated between the laser diode 210 and the grating 230, so that the loss in the resonator can be suppressed. In this manner, according to the second embodiment, it is possible to suppress the increase in loss in the resonator and to reduce noises of the output light.

The second embodiment of the present disclosure has been described above with reference to FIG. 6A, FIG. 6B, FIG. 7, FIG. 8, FIG. 9A, FIG. 9B, FIG. 10, FIG. 11, FIG. 12A, FIG. 12B, FIGS. 13A to 13C, and FIG. 14. As described above, according to the second embodiment, the following effects can be obtained in addition to the effects obtained by the first embodiment.

In the second embodiment, the relay lens 250 formed by the cylindrical lenses 251 and 252 is further provided with respect to the first embodiment. Therefore, by adjusting the position of the relay lens 250 (cylindrical lenses 251 and 252) in the x-axis and y-axis directions, it is possible to adjust the inclination of the optical axis in the x-axis and y-axis directions. Further, by adjusting the position of the relay lens 250 (cylindrical lenses 251 and 252) in the z-axis direction, it is possible to control the chromatic dispersion of the output light.

Furthermore, in the second embodiment, since the relay lens 250 is formed by the cylindrical lenses 251 and 252, the confocal points are formed on the light emitting surface of the laser diode 210 and the reflection surface of the grating 230, it is possible to suppress, in controlling the chromatic dispersion, the increase in loss in the resonator and to reduce noises of the output light.

Note that although in the above description, the relay lens 440 illustrated in FIG. 6A and FIG. 6B is formed by the pair of spherical lenses 441 and 442 and the relay lens 250 illustrated in FIG. 12A and FIG. 12B is formed by the pair of cylindrical lenses 251 and 252, the relay lens used in the second embodiment is not limited to these examples. In the second embodiment, any lens structure may be employed as long as a light path is formed such that the light is incident with the predetermined width D2 with respect to the arrangement direction of the grooves on the x-z plane and the confocal points are formed on the light emitting surface of the laser diode 110 and the reflection surface of the grating 130 on the y-z plane, without limitation on the type and number of lenses forming the relay lens and the type and number of lenses provided between the laser diode 110 and the grating 130.

<4. Modulation Examples>

Next, modulation examples of the first and second embodiments of the present disclosure will be described.

(4-1. Application to MOPA System)

Figure 15:
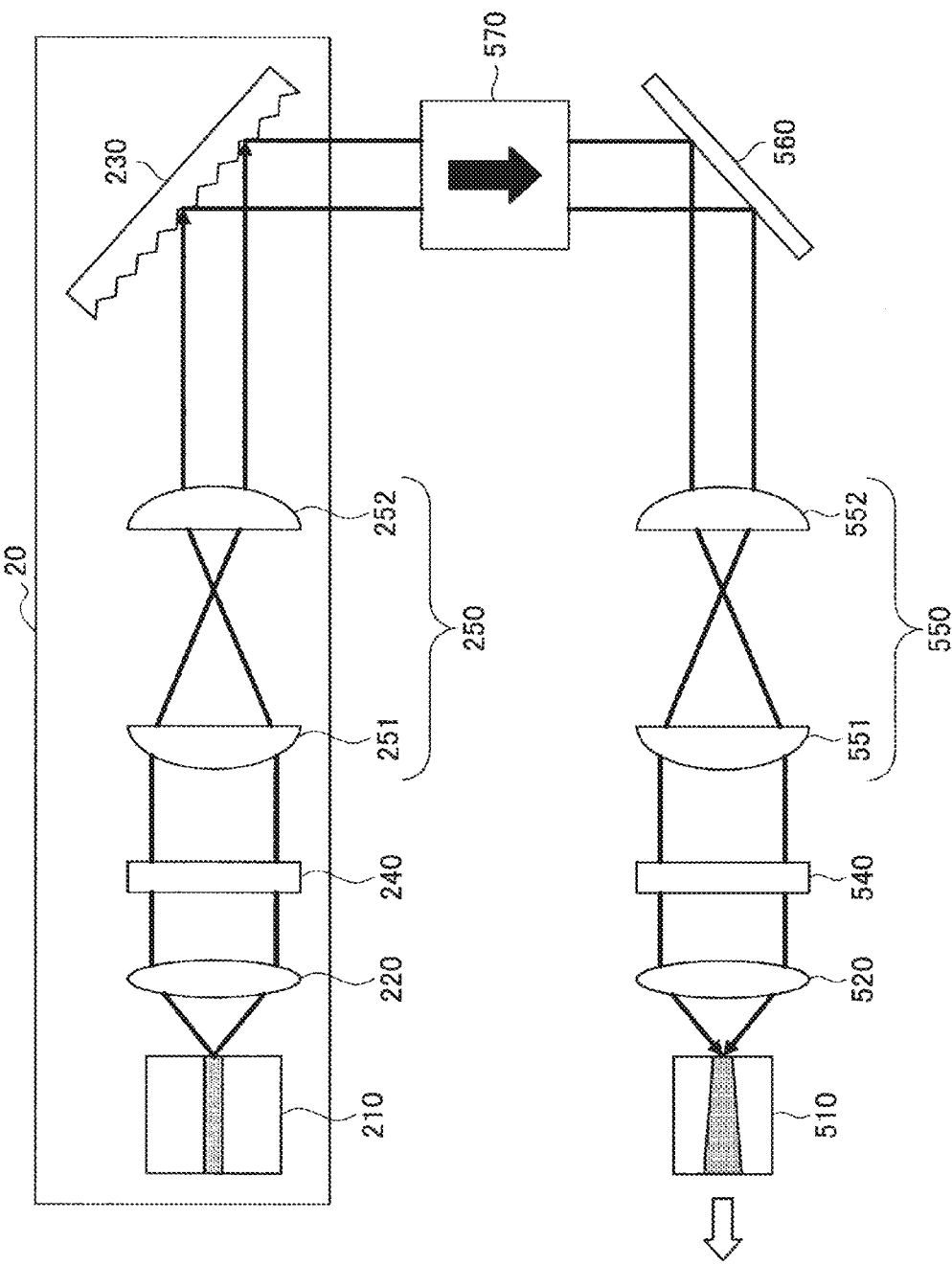
FIG. 15 is a schematic view illustrating a structure example of a MOPA system in which the laser emitting apparatus according to the second embodiment of the present disclosure is used.

First, a schematic structure will be described when any of the laser emitting apparatuses 10 and 20 according to the first and second embodiments is applied to a so-called master oscillator power amplifier (MOPA) system with reference to FIG. 15. FIG. 15 is a schematic view illustrating a structure example of the MOPA system to which the laser emitting apparatus 20 according to the second embodiment of the present disclosure is applied. Note that although the laser emitting apparatus 20 according to the second embodiment is taken as an example of the application to the MOPA system in FIG. 15, the laser emitting apparatus 10 according to the first embodiment is also applicable similarly.

Here, the MOPA system refers to a system in which a mode-locked laser diode (MLLD) in which a semiconductor laser is operated as an external resonator is used as a master laser to amplify the power of the mode-locked laser diode with a semiconductor optical amplifier (SOA). FIG. 15 illustrates a structure example in which the laser emitting apparatus 20 according to the second embodiment is applied as the master laser in the MOPA system.

Referring to FIG. 15, in a MOPA system 50, an isolator 570 and a mirror 560 are provided in a latter part of the laser emitting apparatus 20. Further, a relay lens 550 formed by cylindrical lenses 551 and 552, a cylindrical lens 540, and a collimator lens 520 are provided in a latter part of the mirror 560. Light sequentially passing through these components is eventually incident on an SOA 510 and output outside. Here, the relay lens 550, the cylindrical lens 540, and the collimator lens 520 have the same functions and structures as the relay lens 250, the cylindrical lens 240, and the collimator lens 220 in the laser emitting apparatus 20. In this manner, in the MOPA system 50, the relay lens 550, the cylindrical lens 540, and the collimator lens 520 are provided to be symmetric to the relay lens 250, the cylindrical lens 240, and the collimator lens 220 in the laser emitting apparatus 20 with the grating 230, the isolator 570, and the mirror 560 interposed therebetween.

In the laser emitting apparatus 20, laser light emitted from the laser diode 210 passes through a plurality of lenses (collimator lens 220, cylindrical lens 240, and relay lens 250), the state of the phase of the output light and the expanse of the irradiation region might change from the state of the emitted light from the laser diode 210. In response to this, as illustrated in FIG. 15, a lens system symmetric to the lens system in the laser emitting apparatus 20 is further provided in the MOPA system 50, and accordingly, it is possible to make the state of light incident on the SOA 510 the state emitted from the laser diode 210 again, and to eventually obtain more stable light as output light from the MOPA system 50. Therefore, for example, in a case where the laser emitting apparatus 20 is used as a light source of another optical device further provided in a latter part of the MOPA system 50 or the like, a light source having more stable output can be achieved.

(4-2. Modulation Examples in Lens Structure (Lens System))

Figure 16A:
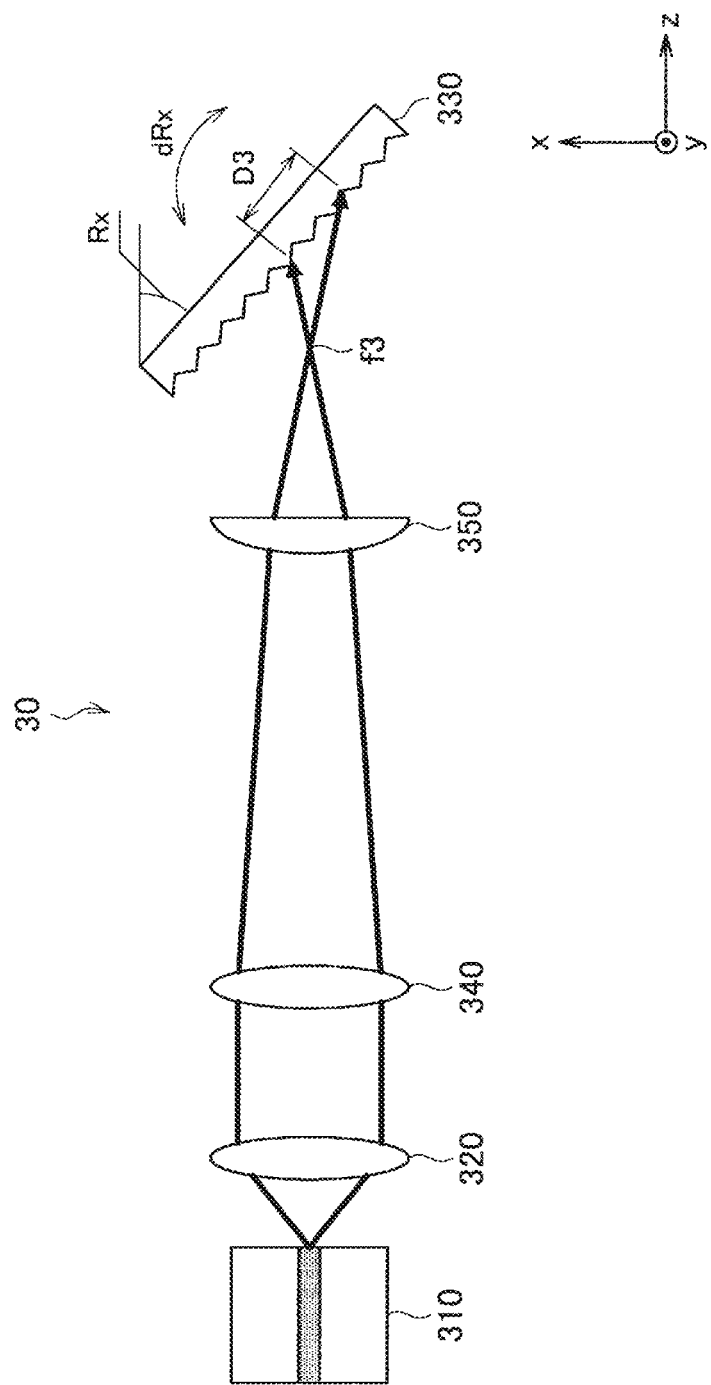
FIG. 16A is a top view illustrating a structure example of a laser emitting apparatus according to a modulation example of the first and second embodiments of the present disclosure.
Figure 16B:
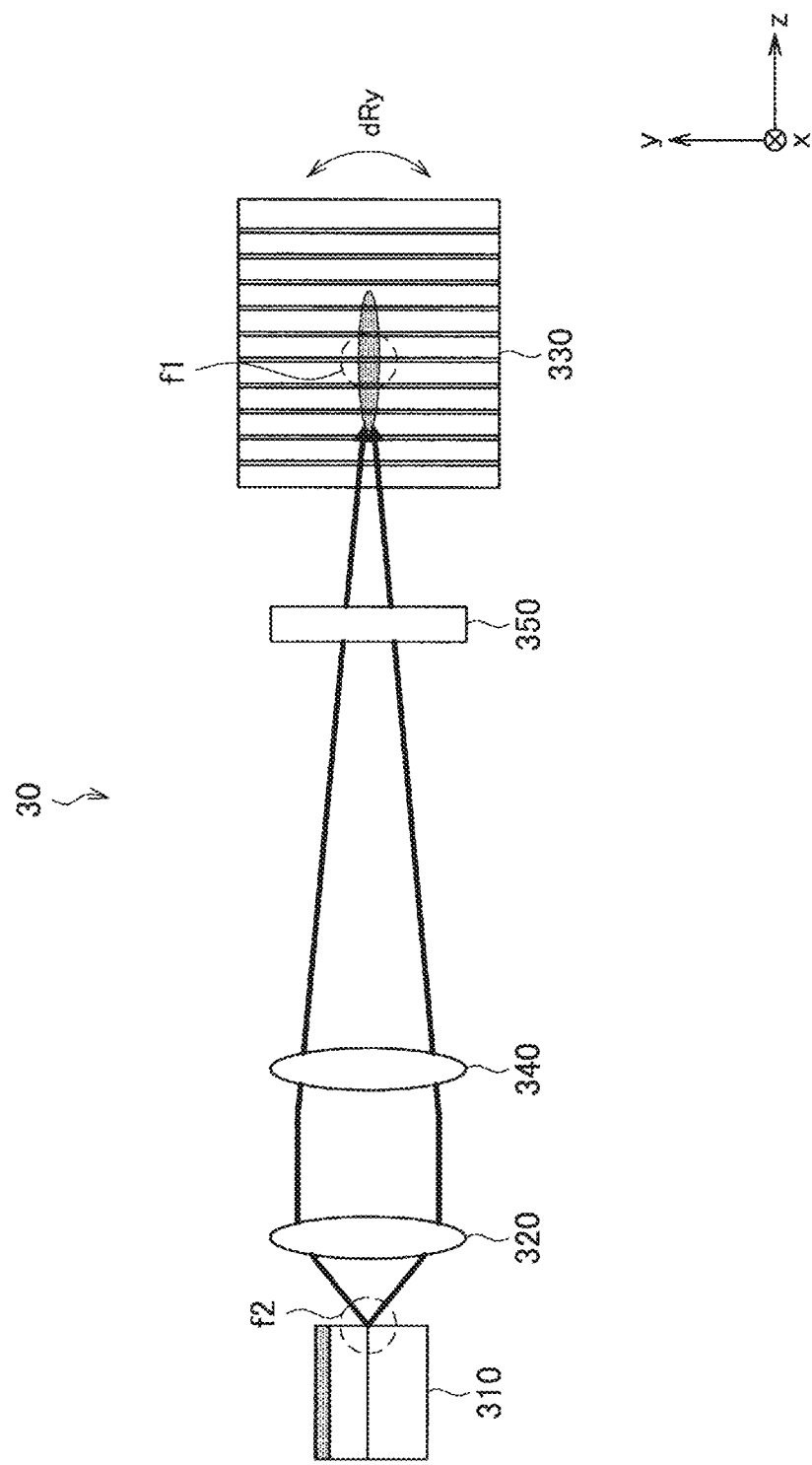
FIG. 16B is a side view illustrating the structure example of the laser emitting apparatus according to the modulation example of the first and second embodiments of the present disclosure.

Next, a modulation example having a different lens system in the laser emitting apparatus according to any of the first and second embodiments will be described with reference to FIG. 16A and FIG. 16B. FIG. 16A is a top view illustrating a structure example of the laser emitting apparatus according to a modulation example of the first and second embodiments of the present disclosure. FIG. 16B is a side view illustrating the structure example of the laser emitting apparatus according to the modulation example of the first and second embodiments of the present disclosure.

Referring to FIG. 16A and FIG. 16B, a laser emitting apparatus 30 according to this modulation example includes a laser diode 310, a collimator lens 320, a spherical lens 340, a cylindrical lens 350, and a grating 330. In the laser emitting apparatus 30, emitted light from the laser diode 310 sequentially passes through the collimator lens 320, the spherical lens 340, and the cylindrical lens 350, and is incident on the grating 330, so that a resonator structure is formed between the laser diode 310 and the grating 330. Here, the laser diode 310, the collimator lens 320, and the grating 330 have the same functions and structures as the laser diodes 110 and 210, the collimator lenses 120 and 220, and the gratings 130 and 230 in the first and second embodiments, and a detailed description thereof is therefore omitted.

Referring to FIG. 16A, the spherical lens 340 and the cylindrical lens 350 of the laser emitting apparatus 30 are provided such that a predetermined position that is closer to the laser diode 310 than to a reflection surface of the grating 330 becomes a focal point f3 on the x-z plane. Specifically, for example, the cylindrical lens 350 is provided so as to function as a spherical lens on the x-z plane, that is, such that the direction having the curvature is the x-axis direction, as illustrated in FIG. 16A. Therefore, in the laser emitting apparatus 30, as illustrated in FIG. 16A, light is incident on the grating 330 so as to have a predetermined expanse (width) D3 with respect to the arrangement direction of the grooves on the grating 330. That is, the cylindrical lens 350 is a lens for chromatic dispersion. In this manner, in the laser emitting apparatus 30, since the emitted light from the laser diode 310 is incident with the width D3 with respect to the arrangement direction of the grooves on the grating 330, the wavelength band of light to be returned to the laser diode 310 as the first-order diffracted light is secured. Further, by changing Rx (generating dRx), the wavelength of light to be resonated can be selected.

Further, referring to FIG. 16B, the spherical lens 340 and the cylindrical lens 350 of the laser emitting apparatus 30 are provided such that the confocal points are formed on the light emitting surface of the laser diode 310 and the reflection surface of the grating 330, on the y-z plane. Specifically, for example, as illustrated in FIG. 16B, the cylindrical lens 350 is provided so as to function as a planar lens on the y-z plane, that is, such that a direction not having the curvature becomes generally parallel to the y-axis direction. Therefore, in the laser emitting apparatus 30, the emitted light from the laser diode 310 is resonated between the focal point f1 on the reflection surface of the grating 330 and the focal point f2 on the light emitting surface of the laser diode 310, and it is possible to suppress influences of the change dRy in the disposition angle of the grating 330 and to suppress the decrease in resonance efficiency. Therefore, according to this modulation example, it is possible to suppress the decrease in resonance efficiency due to dRy and also to secure wavelength selectivity due to dRx.

The structure of the laser emitting apparatus 30 according to the modulation example of the first and second embodiments of the present disclosure has been described above with reference to FIG. 16A and FIG. 16B.

Here, the structure of the laser emitting apparatus according to an embodiment of the present disclosure is not limited to the above-described structure illustrated in FIG. 3A, FIG. 3B, FIG. 12A, FIG. 12B, FIG. 16A, and FIG. 16B. According to the present disclosure, there is no limitation on the structure of the optical system as long as the optical system is formed between the laser diode and the grating such that the emitted light from the laser diode is incident on the grating with the predetermined width with respect to the arrangement direction of the grooves provided on the reflection surface of the grating on the x-z plane and the confocal points are formed on the light emitting surface of the laser diode and the reflection surface of the grating, on the y-z surface. For example, in the modulation example illustrated in FIG. 16A and FIG. 16B, the spherical lens 340 and the cylindrical lens 350 may be inversely positioned. Even in a case where the spherical lens 340 and the cylindrical lens 350 are inversely positioned, the same effects as the laser emitting apparatus 30 illustrated in FIG. 16A and FIG. 16B can be obtained. In this manner, in the structure of the laser emitting apparatus according to the embodiment of the present disclosure, the optical system may be designed appropriately as long as the above conditions are satisfied.

<5. Conclusion>

As described above, according to the first and second embodiments of the present disclosure, the following effects can be obtained.

According to the first embodiment, by providing the cylindrical lens 140, the confocal points are formed on the light emitting surface of the laser diode 110 and the reflection surface of the grating 130. Therefore, the emitted light from the laser diode 110 is resonated more reliably between the focal point f1 on the reflection surface of the grating 130 and the focal point f2 on the light emitting surface of the laser diode 110, and accordingly, it is possible to secure the tolerance to the change in the disposition angle Ry of the grating 130 and to suppress the decrease in resonance efficiency. Further, in the first embodiment, since the cylindrical lens 140 is used instead of a spherical lens in order to provide the confocal points, light is incident with the predetermined expanse (width) D1 with respect to the arrangement direction of the grooves on the grating 130 and the wavelength selectivity is secured. Therefore, it is possible to secure the wavelength selectivity and to suppress the decrease in resonance efficiency due to dRy.

Further, in the second embodiment, in addition to the effects obtained in the first embodiment, the following effects can be obtained.

In the second embodiment, the relay lens 250 formed by the cylindrical lenses 251 and 252 is further provided with respect to the first embodiment. Therefore, by adjusting the position of the relay lens 250 (cylindrical lenses 251 and 252) in the x-axis and y-axis directions, it is possible to adjust the inclination of the optical axis in the x-axis and y-axis directions. Further, by adjusting the position of the relay lens 250 (cylindrical lenses 251 and 252) in the z-axis direction, it is possible to control the chromatic dispersion of the output light. Furthermore, in the second embodiment, since the relay lens 250 is formed by the cylindrical lenses 251 and 252, the confocal points are formed on the light emitting surface of the laser diode 210 and the reflection surface of the grating 230, it is possible to suppress, in controlling the chromatic dispersion, the increase in loss in the resonator and to reduce noises of the output light.

In this manner, in the first and second embodiments, by further providing one or more cylindrical lenses in a structure of a general external resonator laser emitting apparatus, the decrease in resonance efficiency is suppressed. Therefore, a complex structure is not necessary for the first and second embodiments, and more stable output can be obtained with a simpler structure.

It should be understood by those skilled in the art that various modifications, combinations, sub-combinations and alterations may occur depending on design requirements and other factors insofar as they are within the scope of the appended claims or the equivalents thereof.

Additionally, the present technology may also be configured as below.

(1) A laser emitting apparatus including:
a semiconductor laser configured to emit light of a predetermined wavelength;
a grating provided in a latter part of the semiconductor laser and configured to form a resonator structure with the semiconductor laser by reflecting emitted light from the semiconductor laser and to extract part of the emitted light outside; and at least one cylindrical lens provided between the semiconductor laser and the grating in a manner that confocal points are formed on a light emitting surface of the semiconductor laser and a reflection surface of the grating.

(2) The laser emitting apparatus according to (1),
wherein the cylindrical lens is provided in a manner that one focal point of the confocal points is formed on the reflection surface of the grating, in a plane regulated by an optical axis direction and a first direction which is a stretching direction of grooves provided on the grating.

(3) The laser emitting apparatus according to (1) or (2),
wherein the cylindrical lens is provided in a manner that the emitted light from the semiconductor laser is incident on the reflection surface of the grating with a predetermined expanse on a plane regulated by an optical axis direction and a second direction which is an arrangement direction of grooves provided on the grating.

(4) The laser emitting apparatus according to (2),
wherein the first direction is a direction in which an active layer and a cladding layer are stacked in the semiconductor laser.

(5) The laser emitting apparatus according to any one of (1) to (4), further including: a pair of cylindrical lenses as a relay lens between the semiconductor laser and the grating.

(6) The laser emitting apparatus according to (5),
wherein an incident angle of the emitted light on the grating is controlled by a position of the cylindrical lens in an optical axis direction, the cylindrical lens provided in a latter part of the pair of cylindrical lenses forming the relay lens.

(7) The laser emitting apparatus according to any one of (1) to (4),
wherein the cylindrical lens is provided in a manner that a predetermined position which is closer to the semiconductor laser than to the reflection surface of the grating becomes a focal point on a plane regulated by an optical axis direction and a second direction which is an arrangement direction of grooves provided on the grating.

(8) The laser emitting apparatus according to (7),
wherein an incident angle of the emitted light on the grating is controlled by a position of the cylindrical lens along the optical axis direction.

(9) The laser emitting apparatus according to any one of (1) to (8),
wherein the laser emitting apparatus is a mode-locked laser diode (MLLD) in a master oscillator power amplifier (MOPA) system which amplifies a power of the mode-locked laser diode with a semiconductor optical amplifier (SOA) by using the MLLD in which the semiconductor laser is operated as an external resonator, and
wherein in a former part of the SOA in the MOPA system, a second lens group is provided to be symmetrical to a first lens group with respect to an optical axis in the MOPA system, the second lens group having a same or substantially same structure as the first lens group provided between the semiconductor laser and the grating in the laser emitting apparatus.

(10) A method for manufacturing a laser emitting apparatus, the method including: providing a semiconductor laser which emits light of a predetermined wavelength; providing a grating in a latter part of the semiconductor laser, the grating being configured to form a resonator structure with the semiconductor laser by reflecting emitted light from the semiconductor laser; and
providing at least one cylindrical lens between the semiconductor laser and the grating in a manner that confocal points are formed on a light emitting surface of the semiconductor laser and a reflection surface of the grating.

Moreover, the present technology may also be configured as below.

(1) A laser emitting apparatus comprising:
a semiconductor laser;
a grating positioned relative to the semiconductor laser to form a resonator structure therebetween; and
an optical system positioned between the semiconductor laser and the grating, the optical system configured and arranged so that confocal points are formed on both a light emitting surface of the semiconductor laser and a reflection surface of the grating.

(2) The laser emitting apparatus according to (1), wherein the optical system includes a cylindrical lens.

(3) The laser emitting apparatus according to (2), wherein the cylindrical lens has a cylindrical surface on at least one surface of the lens, the cylindrical surface having a first surface that has a curvature in a first direction, but does not have a curvature in a second direction that is orthogonal to the first direction.

(4) The laser emitting apparatus according to (3), wherein the first surface of the cylindrical lens functions as a spherical lens in the first direction and as a planar lens in the second direction.

(5) The laser emitting apparatus according to (2), wherein the cylindrical lens is configured to condense a spot diameter of light emitted from the semiconductor laser in a first direction, and substantially maintain the spot diameter of the light emitting from the semiconductor laser in a second direction that is orthogonal to the first direction.

(6) The laser emitting apparatus according to (1), wherein the semiconductor laser is a laser diode including an active layer formed between a p-type semiconductor cladding layer and an n-type semiconductor cladding layer.

(7) The laser emitting apparatus according to (6), wherein the semiconductor laser includes a light-emitting side and a back side that is opposite to the light-emitting side, at least a portion of the back side including a reflective coating.

(8) The laser emitting apparatus according to (7), wherein at least a portion of the light-emitting side of the semiconductor laser includes an antireflective coating.

(9) The laser emitting apparatus according to (1), further comprising a collimator lens provided between the semiconductor laser and the optical system, the collimator lens configured to convert light emitted from the semiconductor laser into substantially parallel light.

(10) The laser emitting apparatus according to (1), wherein the optical system includes a relay lens.

(11) The laser emitting apparatus according to (10), wherein the relay lens includes a plurality of spherical lenses.

(12) The laser emitting apparatus according to (11), wherein the spherical lenses are configured such that a lateral movement of only one of the lenses in any direction perpendicular to an optical axis of light emitted from the semiconductor laser changes an inclination angle of the optical axis between the relay lens and the grating relative to the optical axis of the emitted light.

(13) The laser emitting apparatus according to (11), wherein the semiconductor laser emits pulsed laser light, and wherein the spherical lenses are configured such that a movement along an optical axis of light emitted from the semiconductor laser changes a chromatic dispersion characteristic of the pulsed laser light.

(14) The laser emitting apparatus according to (1), wherein the optical system includes a cylindrical lens, and a relay lens including a plurality of spherical lenses.

(15) The laser emitting apparatus according to (1), wherein the optical system includes a spherical lens and a cylindrical lens.

(16) The laser emitting apparatus according to (15), wherein the spherical lens and cylindrical lens are configured and arranged so that a focal point of the emitted light is located between the optical system and the reflection surface of the grating.

(17) The laser emitting apparatus according to (15), wherein the spherical lens is positioned between the cylindrical lens and the grating.

(18) The laser emitting apparatus according to (15), wherein the cylindrical lens is positioned between the spherical lens and the grating.

(19) A master oscillator power amplifier system comprising:
a laser emitting apparatus including
a semiconductor laser,
a grating positioned relative to the semiconductor laser to form a resonator structure therebetween, and
an optical system positioned between the semiconductor laser and the grating, the optical system configured and arranged so that confocal points are formed on both a light emitting surface of the semiconductor laser and a reflection surface of the grating; and
a semiconductor optical amplifier.

(20) The master oscillator power amplifier system according to (19), further comprising an isolator and a mirror optically positioned between the grating of the laser emitting apparatus and the semiconductor optical amplifier.

(21) The master oscillator power amplifier system according to (20), wherein the optical system includes a first cylindrical lens.

(22) The master oscillator power amplifier system according to (21), further comprising a second optical system positioned between the semiconductor optical amplifier and the mirror, the second optical system including a second cylindrical lens.

(23) The master oscillator power amplifier system according to (22), wherein the first cylindrical lens is provided to be symmetric to the second cylindrical lens, with the grating, the isolator, and the mirror interposed between the first optical system and the second optical system.

REFERENCE SIGNS LIST 10, 20, 30, 40 laser emitting apparatus
50 MOPA system
110, 210, 310, 410 laser diode
120, 220, 320, 420, 520 collimator lens
130, 230, 330, 430 grating
140, 240, 350, 540 cylindrical lens
250, 550 relay lens
251, 252, 551, 552 cylindrical lens
340 spherical lens
440 relay lens
441, 442 spherical lens
510 semiconductor optical amplifier (SOA)

The invention claimed is:
1. A laser emitting apparatus comprising:
a semiconductor laser;
a grating positioned relative to the semiconductor laser to form a resonator structure therebetween; and
an optical system positioned between the semiconductor laser and the grating, the optical system configured and arranged so that confocal points are formed on both a light emitting surface of the semiconductor laser and a reflection surface of the grating, wherein the optical system includes a relay lens, wherein the relay lens includes a plurality of spherical lenses, and wherein the spherical lenses are configured such that a lateral movement of only one of the lenses in any direction perpendicular to an optical axis of light emitted from the semiconductor laser changes an inclination angle of the optical axis between the relay lens and the grating relative to the optical axis of the emitted light.

2. The laser emitting apparatus according to claim 1, wherein the optical system includes a cylindrical lens.

3. The laser emitting apparatus according to claim 2, wherein the cylindrical lens has a cylindrical surface on at least one surface of the lens, the cylindrical surface having a first surface that has a curvature in a first direction, but does not have a curvature in a second direction that is orthogonal to the first direction.

4. The laser emitting apparatus according to claim 3, wherein the first surface of the cylindrical lens functions as a spherical lens in the first direction and as a planar lens in the second direction.

5. The laser emitting apparatus according to claim 2, wherein the cylindrical lens is configured to condense a spot diameter of light emitted from the semiconductor laser in a first direction, and substantially maintain the spot diameter of the light emitting from the semiconductor laser in a second direction that is orthogonal to the first direction.

6. The laser emitting apparatus according to claim 1, wherein the semiconductor laser is a laser diode including an active layer formed between a p-type semiconductor cladding layer and an n-type semiconductor cladding layer.

7. The laser emitting apparatus according to claim 6, wherein the semiconductor laser includes a light-emitting side and a back side that is opposite to the light-emitting side, at least a portion of the back side including a reflective coating.

8. The laser emitting apparatus according to claim 7, wherein at least a portion of the light-emitting side of the semiconductor laser includes an antireflective coating.

9. The laser emitting apparatus according to claim 1, further comprising a collimator lens provided between the semiconductor laser and the optical system, the collimator lens configured to convert light emitted from the semiconductor laser into substantially parallel light.

10. The laser emitting apparatus according to claim 1, wherein the semiconductor laser emits pulsed laser light, and wherein the spherical lenses are configured such that a movement along an optical axis of light emitted from the semiconductor laser changes a chromatic dispersion characteristic of the pulsed laser light.

11. The laser emitting apparatus according to claim 1, wherein the optical system includes a cylindrical lens, and a relay lens including a plurality of spherical lenses.

12. The laser emitting apparatus according to claim 1, wherein the optical system includes a spherical lens and a cylindrical lens.

13. The laser emitting apparatus according to claim 12, wherein the spherical lens and cylindrical lens are configured and arranged so that a focal point of the emitted light is located between the optical system and the reflection surface of the grating.

14. The laser emitting apparatus according to claim 12, wherein the spherical lens is positioned between the cylindrical lens and the grating.

15. The laser emitting apparatus according to claim 12, wherein the cylindrical lens is positioned between the spherical lens and the grating.

16. A master oscillator power amplifier system comprising:
   a laser emitting apparatus including
   a semiconductor laser,
   a grating positioned relative to the semiconductor laser to form a resonator structure therebetween, and
   an optical system positioned between the semiconductor laser and the grating, the optical system configured and arranged so that confocal points are formed on both a light emitting surface of the semiconductor laser and a reflection surface of the grating, wherein the optical system includes a relay lens, wherein the relay lens includes a plurality of spherical lenses, and wherein the spherical lenses are configured such that a lateral movement of only one of the lenses in any direction perpendicular to an optical axis of light emitted from the semiconductor laser changes an inclination angle of the optical axis between the relay lens and the grating relative to the optical axis of the emitted light; and
   a semiconductor optical amplifier.

17. The master oscillator power amplifier system according to claim 16, further comprising an isolator and a mirror optically positioned between the grating of the laser emitting apparatus and the semiconductor optical amplifier.

18. The master oscillator power amplifier system according to claim 17, wherein the optical system includes a first cylindrical lens.

19. The master oscillator power amplifier system according to claim 18, further comprising a second optical system positioned between the semiconductor optical amplifier and the mirror, the second optical system including a second cylindrical lens.

20. A master oscillator power amplifier system comprising:
   a laser emitting apparatus including
   a semiconductor laser,
   a grating positioned relative to the semiconductor laser to form a resonator structure therebetween, and
   an optical system positioned between the semiconductor laser and the grating, the optical system configured and arranged so that confocal points are formed on both a light emitting surface of the semiconductor laser and a reflection surface of the grating, wherein the optical system includes a first cylindrical lens;
   a semiconductor optical amplifier;
   an isolator and a mirror optically positioned between the grating of the laser emitting apparatus and the semiconductor optical amplifier; and
   a second optical system positioned between the semiconductor optical amplifier and the mirror, the second optical system including a second cylindrical lens,
   wherein the first cylindrical lens is provided to be symmetric to the second cylindrical lens, with the grating, the isolator, and the mirror interposed between the first optical system and the second optical system.

* * * * *